US011716078B2

(12) United States Patent
Bondade et al.

(10) Patent No.: US 11,716,078 B2
(45) Date of Patent: Aug. 1, 2023

(54) TRANSISTOR SWITCHING BASED ON VOLTAGE SENSING

(71) Applicant: TEXAS INSTRUMENTS INCORPORATED, Dallas, TX (US)

(72) Inventors: Rajdeep Bondade, Richardson, TX (US); Maxim Franke, Dallas, TX (US); Stephen Phillip Savage, Richardson, TX (US); Mrinal Kanti Das, Allen, TX (US); Johan Tjeerd Strydom, Saratoga, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/709,644

(22) Filed: Mar. 31, 2022

(65) Prior Publication Data

US 2023/0188130 A1 Jun. 15, 2023

Related U.S. Application Data

(60) Provisional application No. 63/289,668, filed on Dec. 15, 2021.

(51) Int. Cl.
*H03K 17/082* (2006.01)
*H03K 17/687* (2006.01)

(52) U.S. Cl.
CPC ..... *H03K 17/0822* (2013.01); *H03K 17/6871* (2013.01); *H03K 2217/94* (2013.01)

(58) Field of Classification Search
CPC ........................ H03K 17/0822; H03K 17/6871
See application file for complete search history.

(56) References Cited

U.S. PATENT DOCUMENTS

2012/0200320 A1* 8/2012 Thalheim ........... H03K 17/0828 327/109
2020/0021284 A1* 1/2020 Thalheim ................. H03K 5/24

* cited by examiner

*Primary Examiner* — Metasebia T Retebo
(74) *Attorney, Agent, or Firm* — Charles F. Koch; Frank D. Cimino

(57) ABSTRACT

In one example, an apparatus comprises: a voltage sensing circuit having a voltage sensing terminal and a voltage sensing output, the voltage sensing circuit configured to generate a first voltage at the voltage sensing output representing a second voltage at the voltage sensing terminal; a control circuit having a control circuit input and a control circuit output, the control circuit input coupled to the voltage sensing output, the control circuit configured to: determine a state of a transistor based on the first voltage; and generate a driver signal at the control circuit output based on the state; and a driver circuit having a driver input and a switch control output, the driver input coupled to the control circuit output, the driver circuit configured to provide a current at the switch control output responsive to the driver signal.

18 Claims, 17 Drawing Sheets

TRANSISTOR SWITCHING BASED ON VOLTAGE SENSING

CROSS-REFERENCE TO RELATED APPLICATIONS

The present application claims priority to U.S. Provisional Patent Application No. 63/289,668, which was filed Dec. 15, 2021 and titled "Drain-Sensed Turn-on/Off Switch Control of Power FET," and is hereby incorporated herein by reference in its entirety.

BACKGROUND

A transistor can operate as a switch in various applications, such as being part of a switched mode power supply, an H-bridge, etc. By modulating the voltage of a control terminal (e.g., a gate) of the transistor to enable or disable flow of current between the two current terminals (e.g., drain and source), the transistor can be enabled or disabled as a switch. A transistor includes various parasitic capacitances at the control terminal, such as gate-source capacitance ($C_{GS}$) and gate-drain capacitance ($C_{GD}$), which can be charged or discharged to modulate the voltage of the control terminal. The switching of transistor can be facilitated by a driver circuit, which can be controlled by a switching signal to provide a driver current to charge or discharge the control terminal of the transistor.

SUMMARY

An apparatus comprises a voltage sensing circuit, a control circuit, and a driver circuit. The voltage sensing circuit has a voltage sensing terminal and a voltage sensing output. The voltage sensing circuit is configured to generate a first voltage at the voltage sensing output representing a second voltage at the voltage sensing terminal. The control circuit has a control circuit input and a control circuit output, the control circuit input coupled to the voltage sensing output. The control circuit is configured to: determine a state of a transistor based on the first voltage; and generate a driver signal at the control circuit output based on the state. The driver circuit has a driver input and a switch control output, the driver input coupled to the control circuit output. The driver circuit is configured to provide a current at the switch control output responsive to the driver signal.

A method comprises: receiving a switching signal, and responsive to the switching signal having a first state, providing a discharge current at a control terminal of a transistor. The method further includes responsive to the switching signal transitioning from the first state to a second state, providing a first charge current at the control terminal. The method further includes receiving a first voltage representing a second voltage of a current terminal of the transistor when providing the first charge current, performing a comparison between the first voltage and threshold, and responsive to the first voltage being below the threshold, providing a second charge current at the control terminal of the transistor.

DETAILED DESCRIPTION

Figure 1:
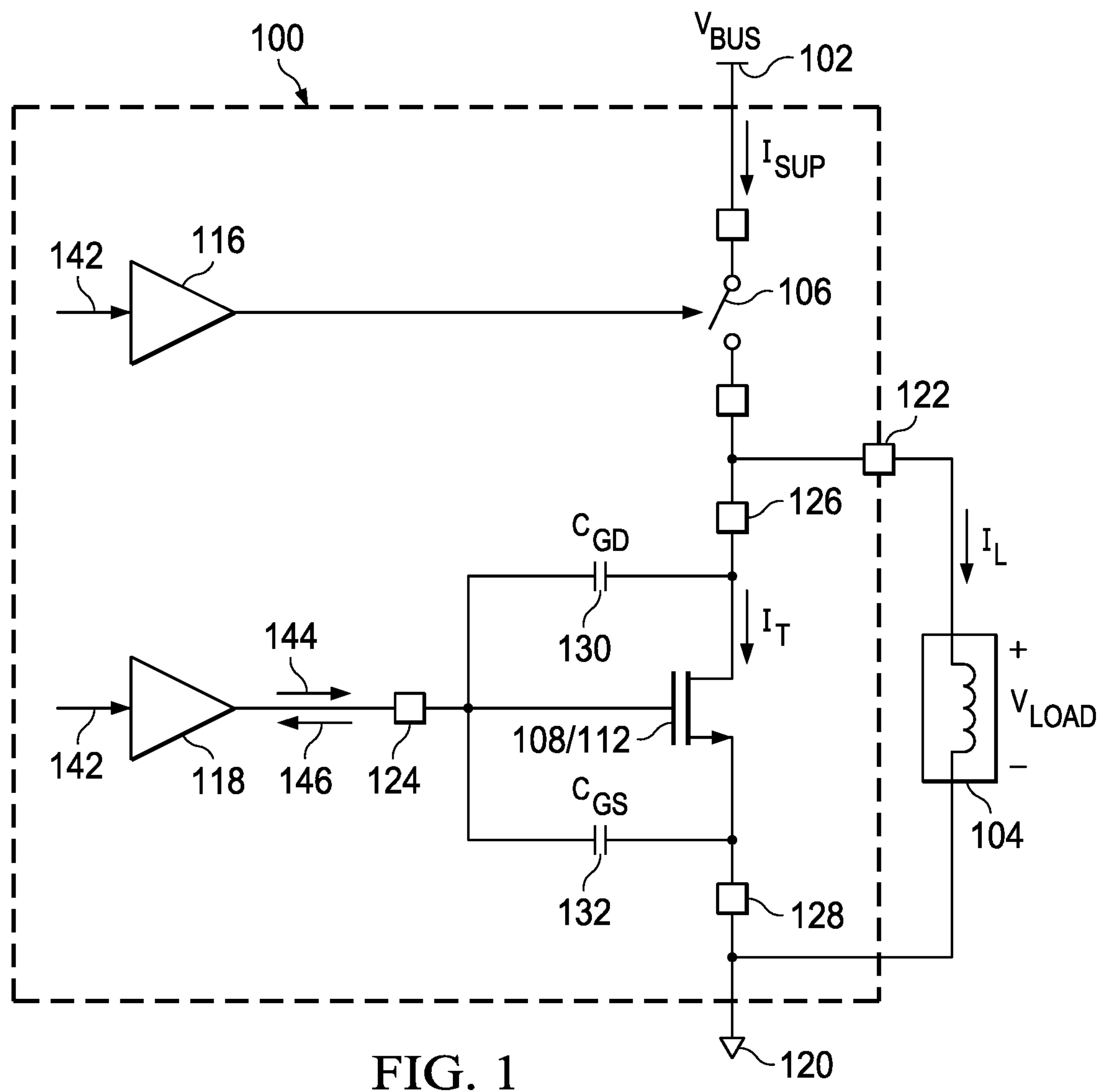
FIG. 1 includes a schematic of an example system in which a transistor operates as a switch.

FIG. 1 includes a schematic of a system 100 in which a transistor operates as a switch. In FIG. 1, system 100 can transfer power from a power supply 102 to a load 104 including an energy storage element such as an inductor (e.g., a motor coil). Power supply 102 can supply a current $I_{SUP}$ and provide a voltage $V_{BUS}$. In some examples, system 100 can be part an H bridge. System 100 can include a high-side switch 106, a low-side switch 108, and driver circuits 116 and 118 that control, respectively, high-side switch 106 and low-side switch 108. High-side switch 106 and low-side switch 108 can be coupled in series between power supply 102 and a ground 120. The switches can also be coupled at a control terminal 122, which can be coupled to load 104.

When system 100 operates, high-side switch 106 and low-side switch 108 can be complimentary and have opposite states, where high-side switch 106 can be enabled by driver circuit 116 if low-side switch 108 is disabled and vice versa. When high-side switch 106 is enabled (and low-side switch 108 is disabled), high-side switch 106 can connect power supply 102 to load 104. The supply current $I_{SUP}$ can flow through high-side switch 106 and energize the energy storage element of load 104, and a voltage at control terminal 122 can reach close to a $V_{LOAD}$ voltage. Also, when high-side switch 106 is disabled, power supply 102 can become disconnected from load 104. Also, when low-side switch 108 is enabled, low-side switch 108 can connect control terminal 122 to ground 120. The energy storage element of load 104 can become de-energized, and a current can flow through low-side switch 108. The voltage at control terminal 122 can also drop to a voltage close ground 120 (e.g., zero volt or a voltage substantially lower than $V_{LOAD}$). One example operation of system 100 from the switching of high-side switch 106 and low-side switch 108 can include changing the polarities of a voltage across load 104. In a case where load 104 is part of a motor coil, such operation can reverse the direction of rotation of a motor.

Each of high-side switch 106 and low-side switch 108 can include a transistor, such as a field-effect transistor (FET), a bipolar junction transistor (BJT), an insulated gate bipolar transistor (IGBT), etc. In FIG. 1, a transistor 112 of low-side switch 108 is shown and represented as a FET. High-side switch 106 can also include a transistor 112. Transistor 112 can have a control terminal 124 (e.g., a gate, a base), a current terminal 126 (e.g., a drain, a collector), and a current terminal 128 (e.g., a source, an emitter). Transistor 112 can also include various parasitic capacitances at control terminal 124, such as a gate-drain capacitance ($C_{GD}$) 130 and a gate-source capacitance ($C_{GS}$) (or a gate-emitter capacitance $C_{GE}$) 132, in a case where transistor 112 is a FET or an IGBT. For low-side switch 108, control terminal 124 can be coupled to an output of driver circuit 118, current terminal 126 can be coupled to control terminal 122, and current terminal 128 can be coupled to ground 120. For high-side switch 106, control terminal 124 can be coupled to an output of driver circuit 116, current terminal 126 can be coupled to power supply 102, and current terminal 128 can be coupled to control terminal 122.

Driver circuit 116/118 can modulate the voltage at control terminal 124 to enable or disable transistor 112. The driver circuit can receive a switching signal 142 and, based on the state of switching signal 142, provide a charge current 144 or a discharge current 146 to modulate the voltage at control terminal 124. Specifically, switching signal 142 can be part of a multi-cycle pulse width modulation (PWM) signal. Each cycle of switching signal 142 can have a positive period and a negative period. Switching signal 142 can have a first state (e.g., a deasserted state) in the negative period of a cycle and a second state (e.g., an asserted state) in the positive period of a cycle. For low-side switch 108, switching signal 142 having the first state can indicate that transistor 112 is to be disabled, and switching signal 142 having the second state can indicate that transistor 112 is to be enabled. For high-side switch 106, switching signal 142 having the first state can indicate that transistor 112 is to be enabled, and switching signal 142 having the second state can indicate that transistor 112 is to be disabled.

If the state of switching signal 142 indicates that transistor 112 is to be enabled, driver circuit 114 can provide charge current 144 to charge parasitic capacitances 130 and 132, which can raise the voltage difference between control terminal 124 and current terminal 128 (a $V_{GS}$ voltage for a FET, a $V_{GE}$ voltage for an IGBT) to above a threshold. This enables a current channel between current terminals 126 and 128 to conduct a transistor current $I_T$. In a case where transistor 112 is low-side switch 108, the transistor current can be equal to the load current IL as load 104 de-energizes. In a case where transistor 112 is high-side switch 106, the transistor current can be equal to the supply current $I_{SUP}$. The voltage of current terminal 126 can also be brought close to the voltage of current terminal 128. On the other hand, if the state of switching signal 142 indicates that transistor 112 is to be disabled, driver circuit 114 can provide discharge current 146 to discharge parasitic capacitances 130 and 132, which can reduce the voltage difference between control terminal 124 and current terminal 128 to below the threshold to disable the current channel and disconnect current terminal 126 from current terminal 128.

Figure 2:
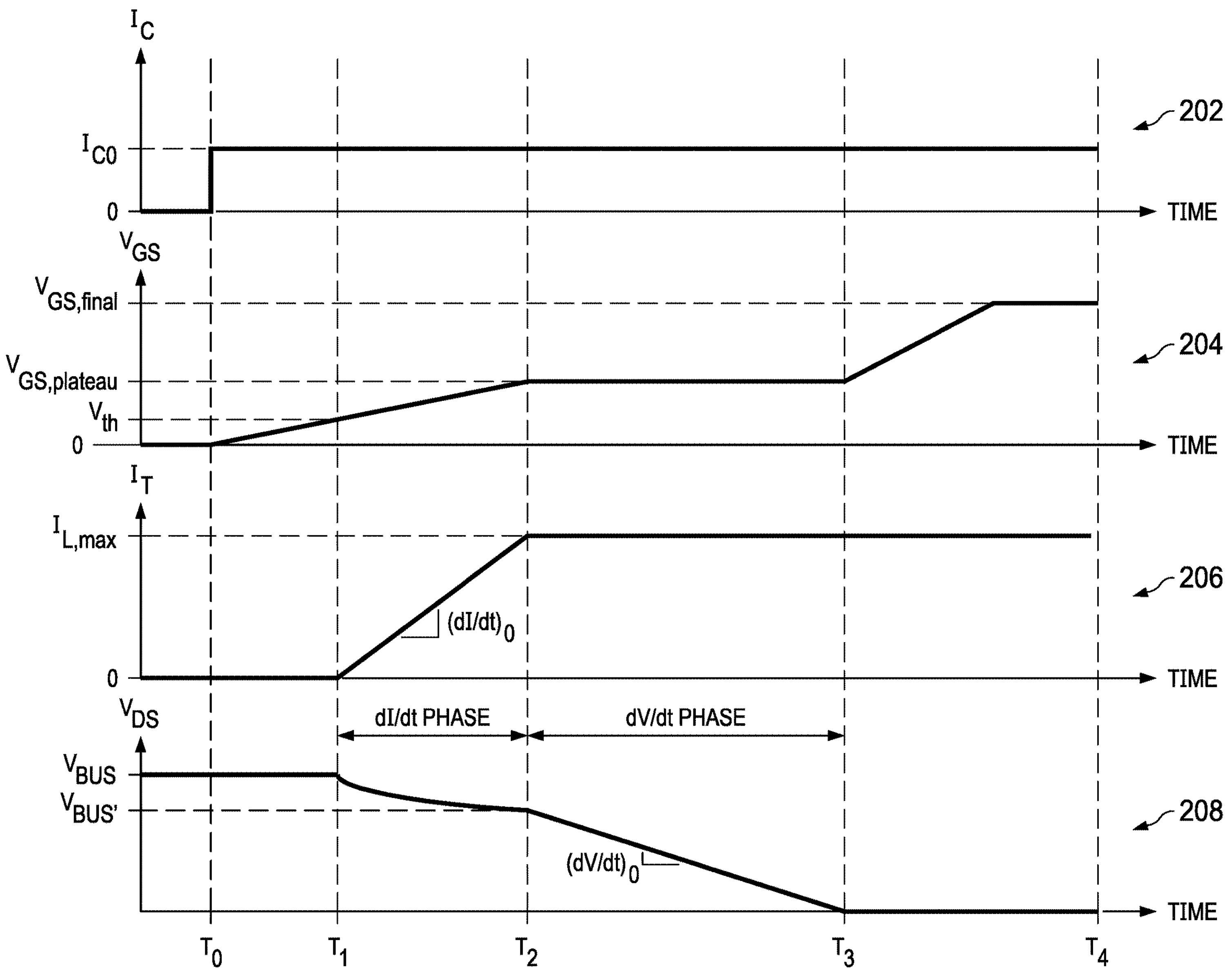
FIGS. 2-4 include waveform graphs that illustrate example operations of the transistor of FIG. 1.

FIG. 2 includes waveform graphs that illustrate example operations of transistor 112 of low-side switch 108 controlled by driver circuit 118. FIG. 2 includes graphs 202, 204, 206, and 208. Graph 202 illustrates the time variation of charge current 144, which is labelled $I_C$ in FIG. 2. Graph 204 illustrates the time variation of a voltage difference between control terminal 124 and current terminal 128, which can be a $V_{GS}$ (for a FET) or a $V_{GE}$ (for an IGBT) voltage, and the voltage difference is labelled $V_{GS}$ in FIG. 2. Graph 206 illustrates the time variation of the drain current $I_D$ that flows through transistor 112. Also, graph 208 illustrates the time variation of a voltage difference between current terminals 126 and 128, which can be a $V_{DS}$ (for a FET) or a $V_{DE}$ (for an IGBT) voltage, and the voltage difference is labelled $V_{DS}$ in FIG. 2. In a case where transistor 112 is an IGBT, graph 208 can represent the time variation of a drain-emitter voltage. For low-side switch 108, the voltage of current terminal 128 can be equal to a ground voltage of ground 120, and for high-side switch 106, the voltage of current terminal 128 can be equal to $V_{BUS}$.

Before time $T_0$, driver circuit 118 may disable transistor 112 of low-side switch 108 by providing discharge current 146 to discharge parasitic capacitances 130 and 132, responsive to switching signal 142 having a first state (e.g., having a deasserted state representing a logical zero) during a negative period of a cycle. Accordingly, charge current $I_C$, gate-source voltage $V_{GS}$, and the drain current $I_D$ can be at or close to zero. Also, high-side switch 106 is enabled to connect current terminal 126 of transistor 112 (of low-side switch 108) to power supply 102, and the voltage at current terminal 126 (and/or $V_{DS}$) can be equal to $V_{BUS}$.

Referring to graph 202, at time $T_0$ driver circuit 114 can provide charge current 144 ($I_C$) to charge parasitic capacitances 130 and 132, responsive to switching signal 142 being at a second state (e.g., having an asserted state representing a logical one). In the example of FIG. 2, driver circuit 114 can provide a constant charge current at $I_{C0}$ during the positive period of a cycle of switching signal 142, and the positive period can span between $T_0$ and $T_4$.

Referring to graphs 204, 206, and 208, which can depict a hard-switching scenario, between $T_0$ and $T_1$, the $C_{GS}$ and $C_{GS}$ capacitances at control terminal 124 can be charged by charge current 144, with the majority of the charge current charging the $C_{GS}$ capacitance. The $V_{GS}$ voltage increases with time but remains below the threshold voltage $V_{th}$, and transistor 112 remains disabled. Accordingly, transistor current ($I_T$) remains zero and $V_{DS}$ remains at the $V_{BUS}$ voltage. The energy storage element of load 104 has not start de-energizing, and the load current $I_L$ can be zero.

Between $T_1$ and $T_2$, as the charge current $I_{C0}$ continues charging $C_{GS}$ capacitance, gate-source voltage $V_{GS}$ can increase above the threshold voltage $V_{th}$, and transistor 112 starts to conduct a non-zero current $I_T$. The transistor current $I_T$ also increases with the $V_{GS}$ voltage, and the transistor current can be equal to the load current $I_L$ from load 104 as the energy storage element of load 104 de-energizes. The rate of increase of $I_T$, labelled $(dI/dt)_0$ in FIG. 2, can reflect the rate of increase of $V_{GS}$ voltage, which can be based on the rate of charging of the $C_{GS}$ capacitance and the charge current $I_{C0}$. The duration between $T_1$ and $T_2$ can be a dI/dt phase of enabling of transistor 112. Also, as the drain current $I_T$ increases between $T_1$ and $T_2$, the voltage at current terminal 126 (and $V_{DS}$) also reduces. This can be attributed to the parasitic inductance at current terminal 126. At $T_2$, the $V_{DS}$ voltage drops to $V_{BUS}'$.

Between $T_2$ and $T_3$, the transistor current $I_T$ can be equal to the maximum load current $I_{L,max}$ supplied by load 104 as the energy storage element fully de-energizes. Also, most of the charge current $I_{C0}$ can be diverted to charge the $C_{GD}$ capacitance, which allows $V_{DS}$ to drop from $V_{BUS}'$ to a value close to zero given by the on-resistance of transistor 112 and transistor current $I_T$. The rate of decrease of $V_{DS}$, labelled $(dV/dt)_0$ in FIG. 2, can also be based on the rate of charging of the $C_{GD}$ capacitance and the charge current $I_{C0}$. The duration between $T_2$ and $T_3$ can be a dV/dt phase of enabling of transistor 112. Also, as little (or none of) the charge current $I_{C0}$ charges the $C_{GS}$ capacitance, the $V_{GS}$ voltage can stop increasing and stay at a plateau voltage $V_{GS,plateau}$, which can define the on-resistance of transistor 112 during the time between $T_2$ and $T_3$.

Between $T_3$ and $T_4$, after the dV/dt phase ends, the charge current $I_{C0}$ can be used to charge both the $C_{GS}$ and $C_{GD}$ capacitances, and the VGS voltage can increase to a $V_{GS,final}$ value. The $V_{GS,final}$ value can set final on-resistance of transistor 112 and the final $V_{DS}$ across transistor 112 for the rest of positive period of switching signal 142.

As described above, the charge current $I_{C0}$ can set both the rate of increase of drain current dI/dt and the rate of decrease of $V_{DS}$ voltage dV/dt. There can be conflicting requirements for dI/dt and dV/dt, which poses challenges for selecting the charge current $I_{C0}$. Specifically, increasing the charge current $I_{C0}$ can increase dI/dt, which can reduce the duration of the dI/dt phase. Reducing the duration of the dI/dt phase can reduce the amount of time in which transistor 112 conducts a non-zero current while having a non-zero $V_{DS}$ across the transistor. Accordingly, the switching loss incurred by the transistor can be reduced. But increasing the charge current $I_{C0}$ can also increase dV/dt, which can increase electromagnetic interference (EMI) emission by transistor 112. But if driver circuit 114 is to provide a reduced charge current $I_{C0}$ to reduce dV/dt and EMI emission, the dI/dt rate may also reduce, and the dI/dt phase duration and switching loss may increase as a result.

Also, the waveform graphs of FIG. 2 can illustrate a normal operation of system 300. The behavior of system 100 can deviate from FIG. 1 if, for example, high-side switch 106 fails to be disabled when low-side switch 108 is enabled (or vice versa), which can give rise to a short circuit condition. As another example, when low-side switch 108 is enabled to conduct the load current $I_L$ supplied by load 104 as the energy storage element de-energizes, the load current $I_L$ (and the transistor current $I_T$ conducted by transistor 112) can become higher than the current rating of transistor 112 if, for example, there is a current surge in load 104. This can give rise to an overcurrent (OC) condition.

Figure 3:
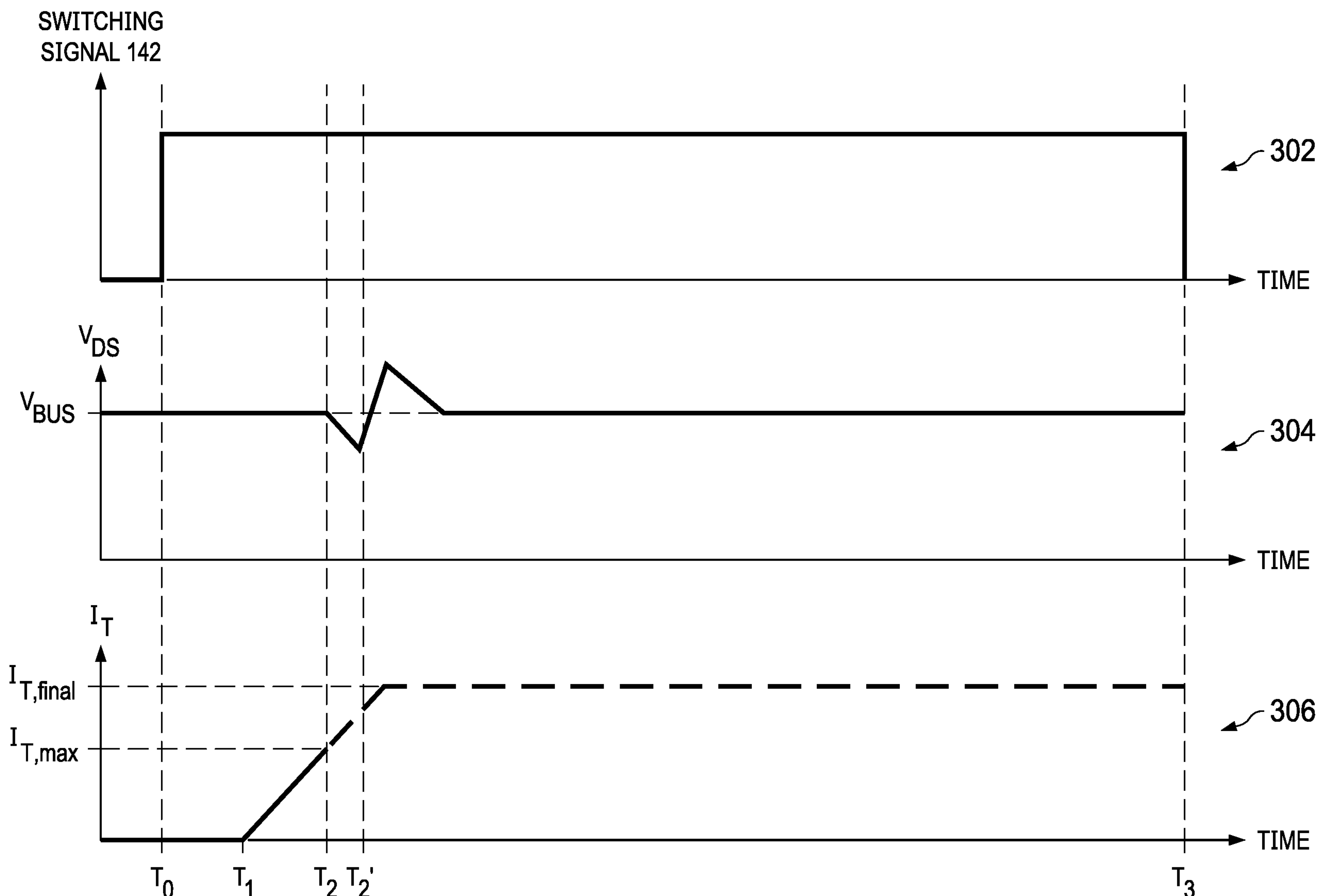

FIG. 3 includes waveform graphs that illustrate operations of transistor 112 of low-side switch 108 in a short circuit condition. FIG. 3 includes a graph 302 of time variation of switching signal 142, a graph 304 of the $V_{DS}$ voltage across transistor 112, and a graph 306 of a transistor current $I_T$ conducted by transistor 112.

Before time $T_0$, low-side switch 108 can be disabled and high-side switch 106 can be enabled, and the $V_{DS}$ voltage across transistor 112 can be equal to $V_{BUS}$. Also, the transistor current $I_T$ can be equal to zero as transistor 112 is disabled.

At time $T_0$, switching signal 142 can transition from the first state to the second state. Switching signal 142 can have the second state between $T_0$ and $T_3$, which can correspond to a positive period of switching signal 142. Driver circuit 116 can provide a control signal to disable high-side switch 106, and driver circuit 118 can provide a charge current 144 to enable transistor 112 of low-side switch 108. But high-side switch 106 may be faulty and remain enabled.

At time $T_1$, the dI/dt phase starts, and the transistor current $I_T$ increases. As both high-side switch 106 and low-side switch 108 are enabled, transistor 112 can receive the supply current $I_{SUP}$ from high-side switch 106 and power supply 102, and the transistor current $I_T$ may reach the current rating of transistor 112 (labelled $I_{T,max}$ in FIG. 3) at time $T_2$.

At time $T_2$, the $V_{DS}$ voltage across transistor 112 can start dropping. But as high-side switch 106 remains enabled, the $V_{DS}$ voltage can rise back up to or above $V_{BUS}$ at time $T_2'$. For the rest of the positive period of switching signal 142, which can end at time $T_3$, the $V_{DS}$ voltage can remain at $V_{BUS}$, and the transistor current $I_T$ may remain above $I_{T,max}$. The transistor current can continue increasing beyond $I_{T,max}$ until it reaches a value $I_{T,final}$, which can be limited by the on-resistances of high-side switch 106 and low-side switch 108.

Figure 4:
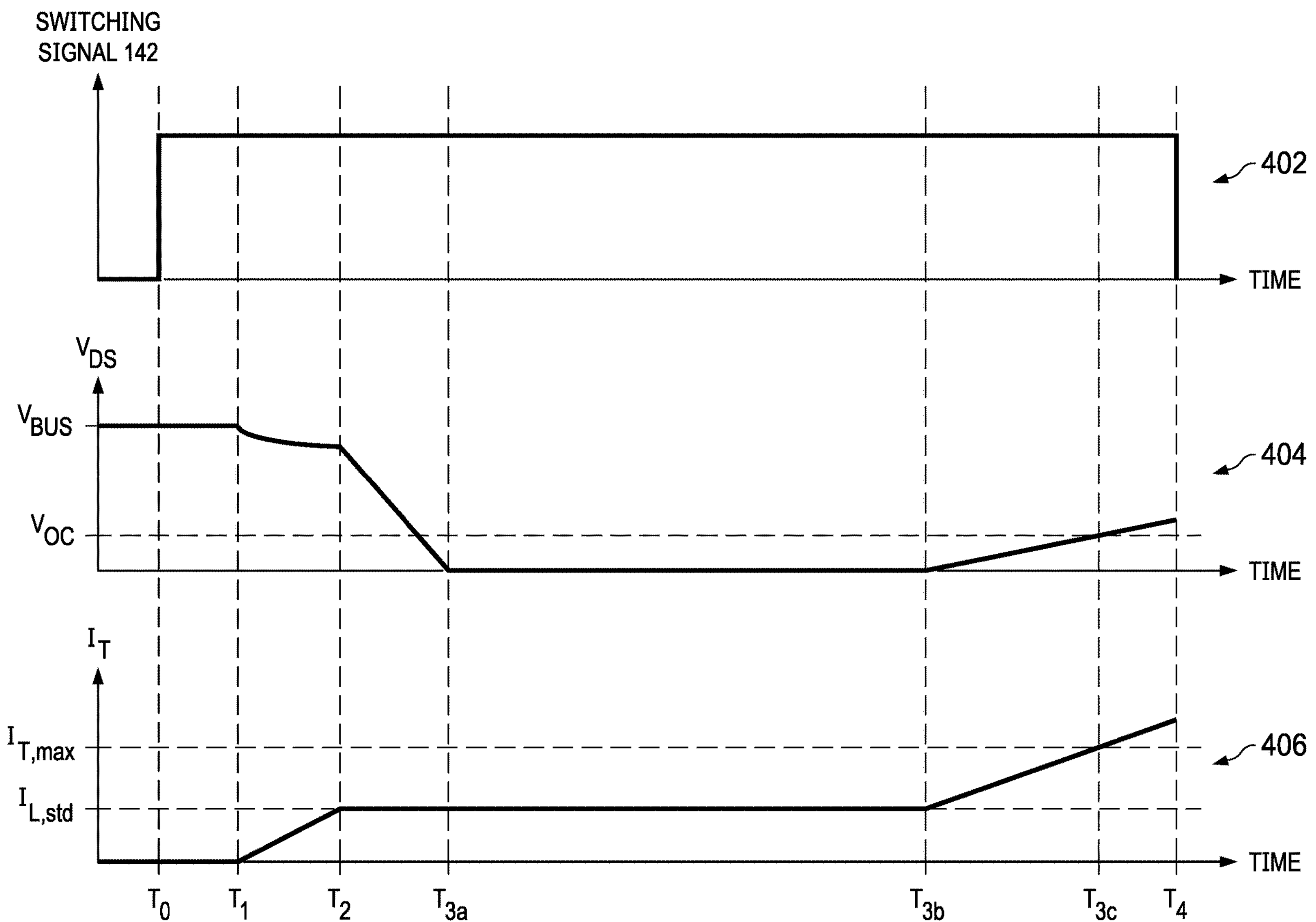

FIG. 4 includes waveform graphs that illustrate operations of transistor 112 (of low-side switch 108 or high-side switch 106) in an overcurrent condition. FIG. 4 includes a graph 402 of time variation of switching signal 142, a graph 404 of the $V_{DS}$ voltage across transistor 112, and a graph 406 of a transistor current $I_T$ conducted by transistor 112.

Before time $T_0$, low-side switch 108 can be disabled and high-side switch 106 can be enabled, and the $V_{DS}$ voltage across transistor 112 can be equal to $V_{BUS}$. Also, the transistor current $I_T$ can be equal to zero as transistor 112 is disabled.

At time $T_0$, switching signal 142 can transition from the first state to the second state. Switching signal 142 can be have the second state between $T_0$ and $T_3$, which can correspond to a positive period of switching signal 142. Driver circuit 116 can provide a control signal to disable high-side switch 106, and driver circuit 118 can provide a charge current 144 to enable transistor 112 of low-side switch 108. In the example of FIG. 4, high-side switch 106 can be disabled responsive to the control signal of driver circuit 116.

At time $T_1$, the dI/dt phase starts, and the transistor current $I_T$ increases and can reach the steady-state load current $I_{L,std}$ at time $T_2$. The $V_{DS}$ voltage across transistor 112 can also drop due to the parasitic inductance at current terminal 126.

At time $T_2$, the dV/dt phase starts, and the $V_{DS}$ voltage across transistor 112 can start dropping. As high-side switch 106 is disabled, the $V_{DS}$ voltage can drop until it reaches a value close to zero defined by the on-resistance of transistor 112 and the transistor current $I_T$. The dV/dt phase can end at time $T_{3a}$.

The load current at load 104 can stay at $I_{L,std}$ between times $T_{3a}$ and $T_{3b}$. At $T_{3b}$, due to a current surge at load 104, the transistor current $I_T$ start increasing from the steady-state value $I_{L,std}$ and, rises above the current rating $I_{T,max}$ at $T_{3C}$. Accordingly, the $V_{DS}$ voltage across transistor 112 increases starting at $T_{3a}$ and can reach a value $V_{OC}$ at time $T_{3C}$. The $V_{DS}$ voltage can continue rising with the transistor current till the end of the positive period at time $T_4$, and then drop back to $V_{BUS}$ after $T_4$ when the positive period ends.

If transistor 112 is to remain enabled despite the short circuit or overcurrent condition, the safety and reliability of the overall system may be degraded. Specifically, when a short circuit or an overcurrent event occur, the H-bridge including high-side switch 106 and low-side switch 108 can be subject to a high voltage and a high current (e.g., $I_{T,final}$ in FIG. 3), which can cause the operations to go beyond the safe-operating area (SOA) of the switches. Exceeding the SOA can lead to breakdown of the devices of the switches (e.g., transistor 112) and the overall system 100, which can damage or at least reduce the life time of the devices. Further, in those events, significant power dissipation can occur, which can heat up the H-bridge and create safety hazards.

Figure 5:
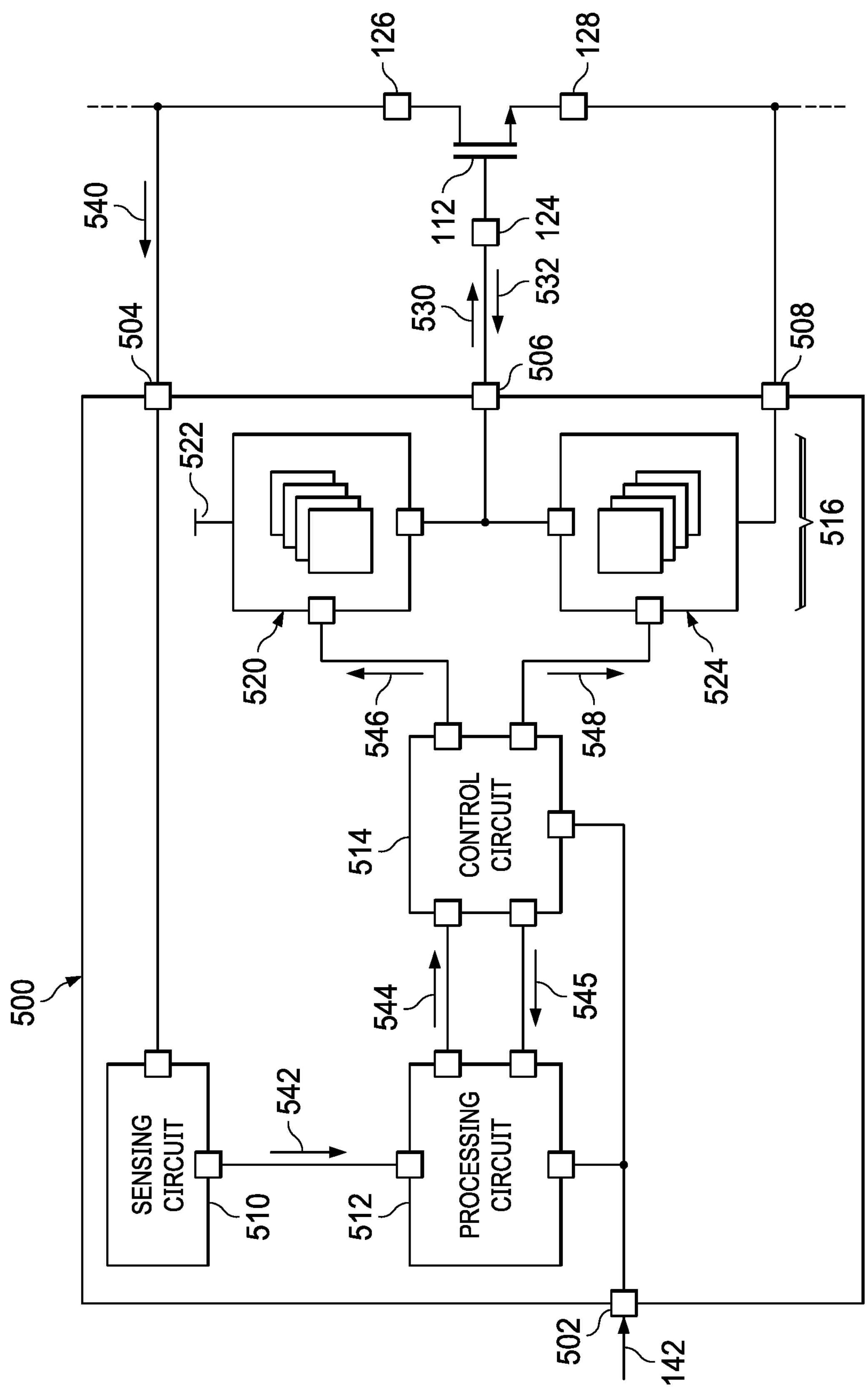
FIG. 5 includes a schematic of an example system to control a transistor.

FIG. 5 is a schematic illustrating an example of a system 500 that can address at least some of the issues above. Specifically, system 500 can have a switching signal terminal 502 to receive switching signal 142, a voltage sensing terminal 504 adapted to be coupled to current terminal 126 (e.g., a drain) of transistor 112, a switch control terminal 506 adapted to be coupled to control terminal 124 (e.g., a gate) of transistor 112, and a reference terminal 508 adapted to be coupled to current terminal 128 (e.g., a source) of transistor 112. System 500 also includes a sensing circuit 510, a processing circuit 512, a control circuit 514, and a driver circuit 516. In some examples, system 500 can be implemented on an integrated circuit (IC), and transistor 112 can be part of or external to the IC including system 500.

Driver circuit 516 can include a charge current source 520 coupled between a power supply 522 and switch control terminal 506, and a discharge current source 524 coupled between switch control terminal 506 and reference terminal 508. In a case where transistor 212 is configured as a low-side switch, reference terminal 508 can be coupled to a voltage source that provides a lower voltage than power supply 522. In a case where transistor 112 is configured as a high-side switch, reference terminal 508 can be coupled to a low-side switch. Charge current source 520 can supply a charge current 530 to charge control terminal 124 and increase the $V_{GS}$ of transistor 112. Also, discharge current source 524 can supply a discharge current 532 to discharge control terminal 124 and reduce the $V_{GS}$ of transistor 112. Each of charge current source 520 and discharge current source 524 can include a segmented current source which allows modulation of the respective charge current 530 and discharge current 532.

Also, sensing circuit 510 can include an input coupled to voltage sensing terminal 504 to receive a voltage signal 540 representing a voltage of current terminal 126 (e.g., drain voltage VD) or a voltage difference between current terminals 126 and 128 (e.g., drain-source voltage $V_{DS}$). Sensing circuit 510 can also include an output coupled to a first input of processing circuit 512 to provide a sensing result signal 542. Processing circuit 512 can have a first input coupled to switching signal terminal 502 to receive switching signal 142, and an output coupled to a first input of control circuit 514 to provide a processing result signal 544. Processing circuit 512 also has a second input coupled to a first output of control circuit 514 to receive a control signal 545. Control circuit 514 can have a second input also coupled to switching signal terminal 502 to receive switching signal 142. Control circuit 514 can have a second output coupled to charge current source 520 and a third output coupled to discharge current source 524. As to be described below, based on processing result signal 544 and/or switching signal 142, control circuit 514 can provide a charge signal 546, which can include a digital code, to selectively enable/disable one or more segmented current sources of charge current source 520 to modulate charge current 530. Also, based on processing result signal 544 and/or switching signal 142, control circuit 514 can provide a discharge signal 548, which can also include a digital code, to selectively enable/disable one or more segmented current sources of discharge current source 524 to modulate discharge current 532.

Specifically, responsive to switching signal 142 having a first state, which can indicate that transistor 112 is to be disabled, control circuit 514 can provide discharge signal 548 to discharge current source 524. Discharge current source 524 can provide discharge current 532 responsive to discharge signal 548 to discharge the $C_{GD}$ and $C_{GS}$ parasitic capacitances of control terminal 124, which can reduce the $V_{GS}$ voltage to below the threshold voltage $V_{th}$ and disable transistor 112. Also, responsive to switching signal 142 transitioning from the first state to a second state indicating that transistor 112 is to be enabled, control circuit 514 can provide charge signal 546 to charge the $C_{GD}$ and $C_{GS}$ parasitic capacitances of control terminal 124 to increase the $V_{GS}$ voltage to above the threshold voltage $V_{th}$ and enable transistor 112.

Also, control circuit 514 can modulate charge current 530 and discharge current 532 based on processing result signal 544 of voltage signal 540. For example, control circuit 514 can detect the dI/dt and dV/dt phases of enabling of transistor 112 based on processing result signal 544, and provide different charge signals 546 for the dI/dt and dV/dt phases, so charge current source 520 can provide different charge currents 530 for the dI/dt and dV/dt phases. Such arrangements can reduce the switching loss by reducing the dI/dt phase duration while maintaining the dV/dt phase duration, which can avoid further increasing the EMI emission by transistor 112 during the switching.

In some examples, after switching signal 142 transitions to the second state, control circuit 514 can monitor for a state of processing result signal 544 to detect short circuit and/or overcurrent conditions. Responsive to detecting the short circuit or overcurrent conditions, control circuit 514 can provide charge signal 546 to disable all segmented current sources of charge current source 520, and provide discharge signal 548 to discharge current source 524, which can provide a discharge current 532 to discharge control terminal 124 and to disable transistor 112.

Disabling transistor 112 in short circuit and overcurrent conditions can improve the safety and reliability of the overall system in such conditions. For example, as transistor 112 is disabled, it does not conduct the high current in the short circuit and overcurrent events, which can avoid the breakdown of transistor 112 and improve reliability and extend the life time of transistor 112. Also, the substantial power loss incurred by transistor 112 and the heating up of transistor 112 (which can create safety hazards) caused by the conduction of high current in the short circuit and overcurrent events can be avoided.

In some examples, control circuit 514 can perform a soft discharge of control terminal 124 by providing a reduced discharge current 532, which can be less than the discharge current provided during a negative period of switching signal 142. The soft discharge can reduce the rate of decrease of the $V_{GS}$ voltage, which can reduce ringing/overshoot at current terminal 126 and the resulting $V_{DS}$ voltage stress on transistor 112.

Figure 6:
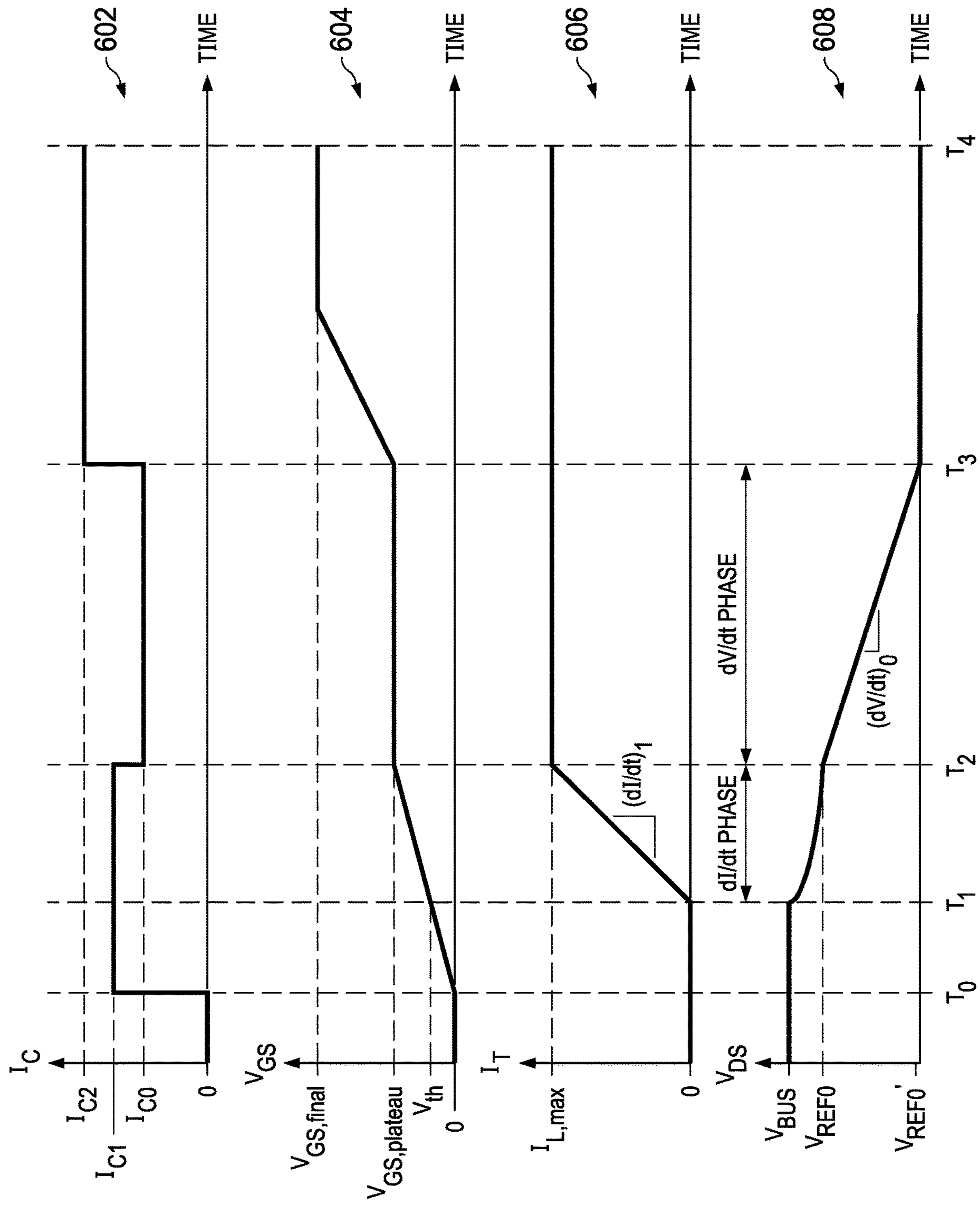
FIGS. 6-8 include waveform graphs that illustrate example operations of the system and transistor of FIG. 5.

FIG. 6 includes waveform graphs that illustrate example operations of system 500 with transistor 112 in system 100 of FIG. 1. FIG. 6 includes graphs 602, 604, 606, and 608. Graph 602 illustrates the time variation of charge current 530, which is labelled $I_C$ in FIG. 6. Graph 604 illustrates the time variation of the $V_{GS}$ voltage between control terminal 124 and current terminal 128 of transistor 112. Graph 606 illustrates the time variation of the transistor current $I_T$ that flows through transistor 112. Also, graph 608 illustrates the time variation of $V_{DS}$ between current terminals 126 and 128. The example operations illustrated in FIG. 6 can be for transistor 112 operating as low-side switch 108 or as high-side switch 106 of system 100.

Before time $T_0$, switching signal 142 is in a negative period of a cycle and has a first state (e.g., a logical zero). Responsive to switching signal 142 having the first state, control circuit 514 can provide charge signal 546 to disable charge current source 520. Control circuit 514 can also provide discharge signal 548, and discharge current source 524 can provide discharge current 532 to discharge control terminal 124. Accordingly, charge current $I_C$, gate-source voltage $V_{GS}$, and the drain current $I_D$ can be at zero, and the voltage of current terminal 126 (and/or $V_{DS}$) can also have the $V_{BUS}$ voltage.

At time $T_0$, switching signal 142 transitions from the first state to the second state, which indicates the start of a positive period of switching signal 142. Responsive to the transition, control circuit 514 can provide discharge signal 548 to disable discharge current source 524. Control circuit 514 can also provide a charge signal 546 including a first digital code, which causes charge current source 520 to provide a charge current 530 having a magnitude of $IC_1$ larger than $IC_0$ of FIG. 2. Most of charge current 530 can charge the $C_{GS}$ capacitance, which increases the $V_{GS}$ voltage to the threshold voltage $V_{th}$ at time $T_1$ and to the plateau voltage $V_{GS,plateau}$ at time $T_2$. Compared with FIG. 2, as control circuit 514 provides an increased charge current $I_{C1}$ to charge the $C_{GS}$ capacitance, it takes less time for the VGS voltage to reach Vth and $V_{GS,plateau}$. The rate of increase of drain current $I_D$, labelled $(dI/dt)_1$ in FIG. 5, is also higher than the rate of increase $(dI/dt)_0$ in FIG. 2. Accordingly, the duration of the dI/dt phase can be reduced in FIG. 5 compared with FIG. 2, and the switching loss incurred by transistor 112 during the dI/dt phase can also be reduced.

The magnitude of $I_{C1}$ can be determined based on various factors. For example, based on a target switching loss during the dI/dt phase, a target of the duration of the dI/dt phase (between $T_1$ and $T_2$) and a target dI/dt rate to achieve the target duration can be determined. The magnitude of $I_{C1}$ to achieve such a target dI/dt rate can then be determined based on, for example, the size of $C_{GS}$ capacitance of transistor 112. In some examples, the magnitude of $I_{C1}$ can also be limited based on the parasitic inductance of control terminal 124, which can be attributed to transistor 112 and the electrical connection between driver circuit 118 and transistor 112. The parasitic inductance can slow the transition of the charge current supplied to control terminal 124 during the transition from the dI/dt phase to the dV/dt phase. Accordingly, control terminal 124 may be charged by $I_{C1}$ for a certain duration after the start of the dV/dt phase, which can increase the dV/dt rate of the voltage at current terminal 126 during the dV/dt phase and increase the EMI. To mitigate the effect of slow transition, the increase of $I_{C1}$ relative to $I_{C0}$ can be limited.

Also, referring to graph 608, between times $T_1$ and $T_2$ the voltage of current terminal 126 (or $V_{DS}$) drops from $V_{BUS}$ as current starts flowing to transistor 112. For example, in a case where transistor 212 is a low-side switch, load current can start flowing from load 104 into transistor 212 as the charge storage element de-energizes, and the high-side switch is disabled. The voltage of current terminal 126 (or $V_{DS}$) can reach $V_{BUS}'$ when the drain current $I_D$ equals the load current $I_{L,max}$, which can indicate the end of the dI/dt phase and the start of the dV/dt phase. Processing circuit 512 can compare sensing result signal 542, which represents voltage signal 540 (and the voltage of current terminal 126 or $V_{DS}$), with a reference voltage $V_{REF0}$ to generate processing result signal 544, and control circuit 514 can detect the end of the dI/dt phase and the start of the dV/dt phase based on processing result signal 544 indicating that sensing result signal 542 is below $V_{REF0}$. The reference voltage $V_{REF0}$ can be based on $V_{BUS}'$. For example, if sensing result signal 542 represents an unscaled version of $V_{DS}$, $V_{REF0}$ can be equal to $V_{BUS}'$. If voltage signal 540 is obtained from scaling down $V_{DS}$ by a factor, $V_{REF0}$ can be obtained from scaling down $V_{BUS}'$ by the same factor.

At time $T_2$, control circuit 514 can detect the end of the dI/dt phase and the start of the dV/dt phase based on processing result signal 544, and provide an updated charge signal 546 including a second digital code to charge current source 520, which can decrease the magnitude of charge current 530 to $I_{C0}$. The magnitude of charge current 530 during the dV/dt phase can be based on a target rate of decrease of $V_{DS}$ across transistor 112 during the dV/dt phase. In FIG. 6, the target rate of decrease of $V_{DS}$ can be equal to $(dV/dt)_0$ as in FIG. 2. Accordingly, system 500 can set the magnitude of charge current 530 to $I_{C0}$ as in FIG. 2.

As to be described below, system 500 can determine the magnitude of charge current 530 during the dV/dt phase for a target rate of decrease of $V_{DS}$ using a feedback loop. System 500 can also determine the magnitude of charge current 530 during the dI/dt phase using the same feedback loop but with an increased target rate of decrease of $V_{DS}$. The increased target rate enables system 500 to increase the magnitude of charge current 530 during the dI/dt phase relative to the dV/dt phase, which can reduce switching loss while avoiding (or at least reducing) further increase in the EMI emission by transistor 112 during the switching. Also, the increased target rate can be limited to mitigate the effect on EMI due to the parasitic inductance's effect on the transition between charge currents. In some examples, the increased target rate due to the higher drive strength of the dI/dt phase can be limited to 10% or less compared with the target rate during the dV/dt phase. The increase in the target rate can be programmable in system 500 to account for various operation conditions such as the physical attributes of transistor 112 (e.g., dimension of control terminal 124), and the electrical connection between switch control terminal 506 and control terminal 124, which may vary the parasitic inductance.

Between $T_3$ and $T_4$, as $V_{DS}$ drops to close to zero, system 500 can compare the voltage of current terminal 126 (or $V_{DS}$) against a reference voltage $V_{REF0}'$ and determine that the dV/dt phase has ended. System 500 can provide a charge current $I_{C2}$ to charge both the $C_{GS}$ and $C_{GD}$ capacitances, and the $V_{GS}$ voltage can increase to a $V_{GS,final}$ value. The $V_{GS,final}$ value can set final on-resistance of transistor 112 and the final $V_{DS}$ across transistor 112 for the rest of positive period of switching signal 142. Control circuit 514 can also provide a charge signal 546 including a third digital code, which causes charge current source 520 to provide a charge current 530 having a magnitude of $I_{C2}$. In some examples, the charge current $I_{C2}$ can be higher than both $I_{C0}$ and $I_{C1}$, which can reduce the time for the $V_{GS}$ voltage to reach the $V_{GS,final}$ value. Accordingly, the time for the on-resistance to reach the final on-resistance value can also be reduced. Also, because the voltage at current terminal 126 is relatively flat after the dV/dt phase ends, increasing the charge current poses negligible impact to EMI.

Figure 7:
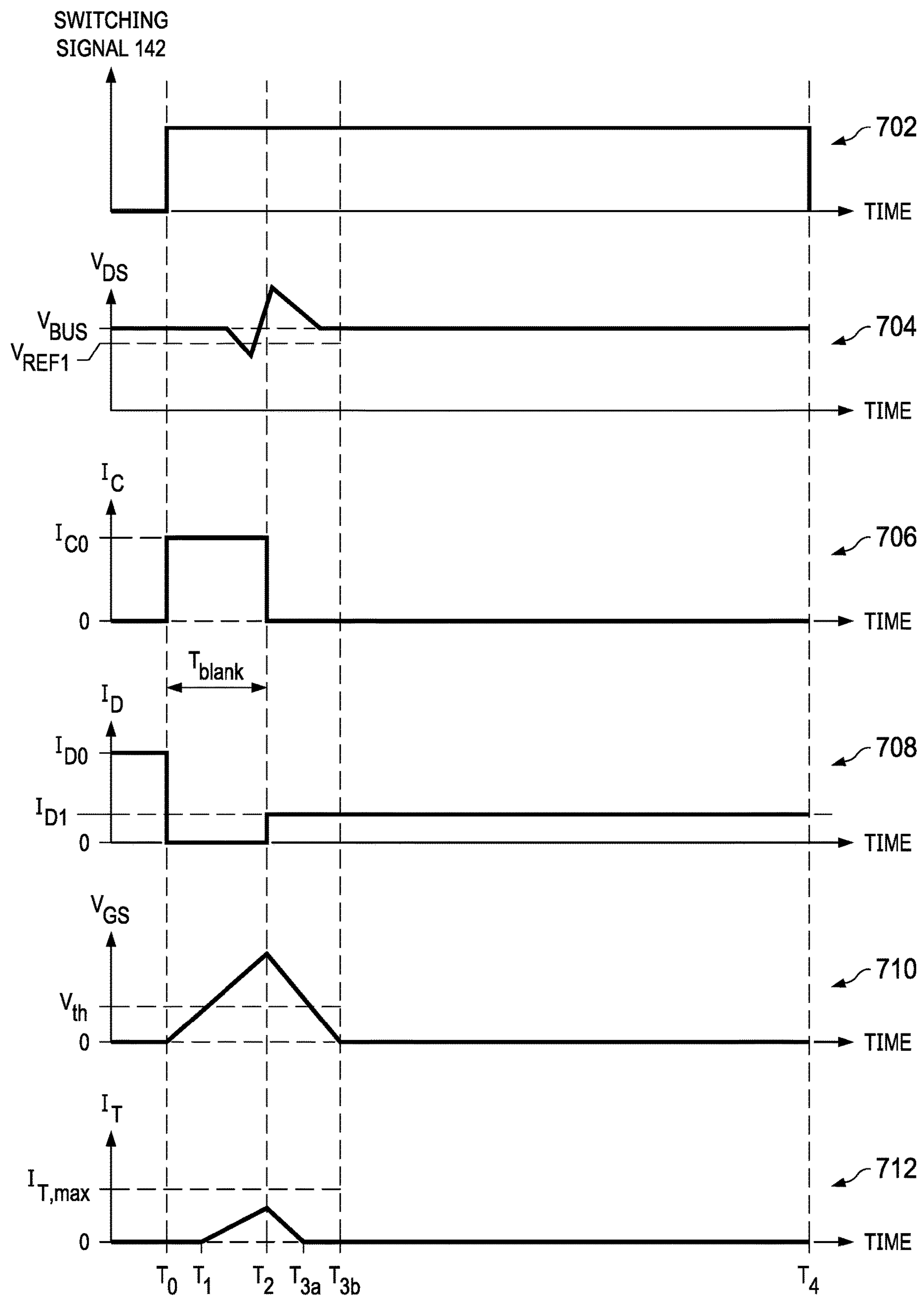

FIG. 7 includes waveform graphs that illustrate example operations of system 500 in modulating charge current 530 and discharge current 532 for transistor 112 in a short circuit condition. In the example shown in FIG. 7, transistor 112 operates as low-side switch 108, and high-side switch 106 is faulty and cannot be disabled. FIG. 7 includes graphs 702, 704, 706, 708, 710, and 712. Graph 702 illustrates the time variation of switching signal 142. Graph 704 illustrates the time variation of the $V_{DS}$ voltage between current terminals 126 and 128. Graph 706 illustrates the time variation of charge current 530 (labelled $I_C$ in FIG. 7), and graph 708 illustrates the time variation of discharge current 532 (labelled $I_D$ in FIG. 7). Also, graph 710 illustrates the time variation of the $V_{GS}$ voltage between control terminal 124 and current terminal 128, and graph 712 illustrates the time variation of the transistor current $I_T$ conducted by transistor 112.

Before time $T_0$, switching signal 142 has a first state (e.g., a logical zero) indicating a negative period. Responsive to switching signal 142 having the first state, control circuit 514 can provide charge signal 546 to disable charge current source 520, and charge current 530 can be at zero. Also, control circuit 514 can also provide discharge signal 548 including a first digital value, and discharge current source 524 can provide a discharge current 532 having a magnitude of $I_{D0}$ corresponding to the first digital value to discharge control terminal 124 and to disable transistor 112. As transistor 112 is disabled, and the voltage of current terminal 126 (or the $V_{DS}$) can also have the $V_{BUS}$ voltage.

At time $T_0$, responsive to switching signal 142 transitioning from the first state to the second state, control circuit 514 can provide discharge signal 548 to disable discharge current source 524, and discharge current 532 can be at zero. Also, control circuit 514 can provide charge signal 546 to charge current source 520 which, responsive to charge signal 546, can provide a charge current 530 having a magnitude of $I_{C0}$ (or $I_{C1}$) to charge the parasitic capacitances of control terminal 124. Processing circuit 512 can also start a timer responsive to the transition of switching signal 142. The timer can expire after a blanking time $T_{blank}$ has expired.

Between $T_0$ and $T_2$, the $V_{GS}$ voltage increases due to the charging of control terminal 124 by charge current 144. The transistor current $I_T$ also starts increasing at $T_1$ when the $V_{GS}$ voltage reaches the threshold voltage $V_{th}$ at time $T_1$. The transistor current $I_T$ can remain below the current rating $I_{T,max}$ between $T_0$ and $T_2$.

At time $T_2$, the blanking time $T_{blank}$ has expired. Processing circuit 512 can compare sensing result signal 542, which represents voltage signal 540 (and the voltage of current terminal 126), with a reference voltage $V_{REF1}$ to generate processing result signal 544. Control circuit 514 can detect the short circuit condition based on processing result signal 544 indicating that sensing result signal 542 is above $V_{REF1}$, which can be based on $V_{BUS}$.

In FIG. 7, because the $V_{DS}$ of transistor 112 exceeds $V_{REF1}$ at $T_2$, control circuit 514 can detect a short circuit condition. In response, control circuit 514 can provide charge signal 546 to disable charge current source 520, and charge current 530 ($I_C$) can become zero. Also, control circuit 514 can provide discharge signal 548 to discharge current source 524, which can provide discharge current 532 to discharge control terminal 124 to disable transistor 112. Because of the zero charge current and non-zero discharge current, the $V_{GS}$ voltage starts to drop at $T_2$. The $V_{GS}$ voltage drops below Val at time $T_{3a}$ and reaches zero at time $T_{3b}$. The transistor current $I_T$ also starts dropping at $T_2$ and reaches zero at $T_{3a}$. The $V_{GS}$ voltage and the transistor current $I_T$ can remain at zero for the rest of the positive cycle, which ends at $T_4$.

The blanking time $T_{blank}$ can account for a delay in the enabling of transistor 112, as it takes time to increase the voltage of control terminal 124 to above the threshold voltage $V_{th}$. Processing circuit 512 can wait for the blanking time to perform the comparison when the voltage of current terminal 126 may drop absent the short circuit condition. Such arrangements can avoid (or at least reduce the likelihood of) false detection of short circuit condition. In some examples, the blanking time $T_{blank}$ can be set based on the duration of the dI/dt phase and/or the dV/dt phase, so that processing circuit 512 can wait till the dI/dt phase completes at $T_2$, or till the later part of dV/dt phase, before performing the comparison. Also, the upper limit of $T_{blank}$ can be based on a maximum transistor current allowed during a short circuit event. The allowed maximum transistor current can be lower than the current rating $I_{MAX}$, which can prevent transistor 112 from operating outside SOA during the short circuit event and the ensuing damage to the transistor.

In some examples, responsive to the detection of a short circuit condition, control circuit 514 can perform a soft discharge operation of control terminal 124 with a discharge current 532 having a magnitude $I_{D1}$, which can be lower than ho before time $T_0$ when switching signal 142 is in the negative period of the cycle. For example, control circuit 514 can provide discharge signal 548 including a second digital value lower than the first digital value included in the discharge signal before $T_0$. By providing a reduced discharge current 532, the rate of decrease of the $V_{GS}$ voltage can be reduced, which can reduce ringing at current terminal 126 and the resulting $V_{DS}$ voltage stress on transistor 112.

Figure 8:
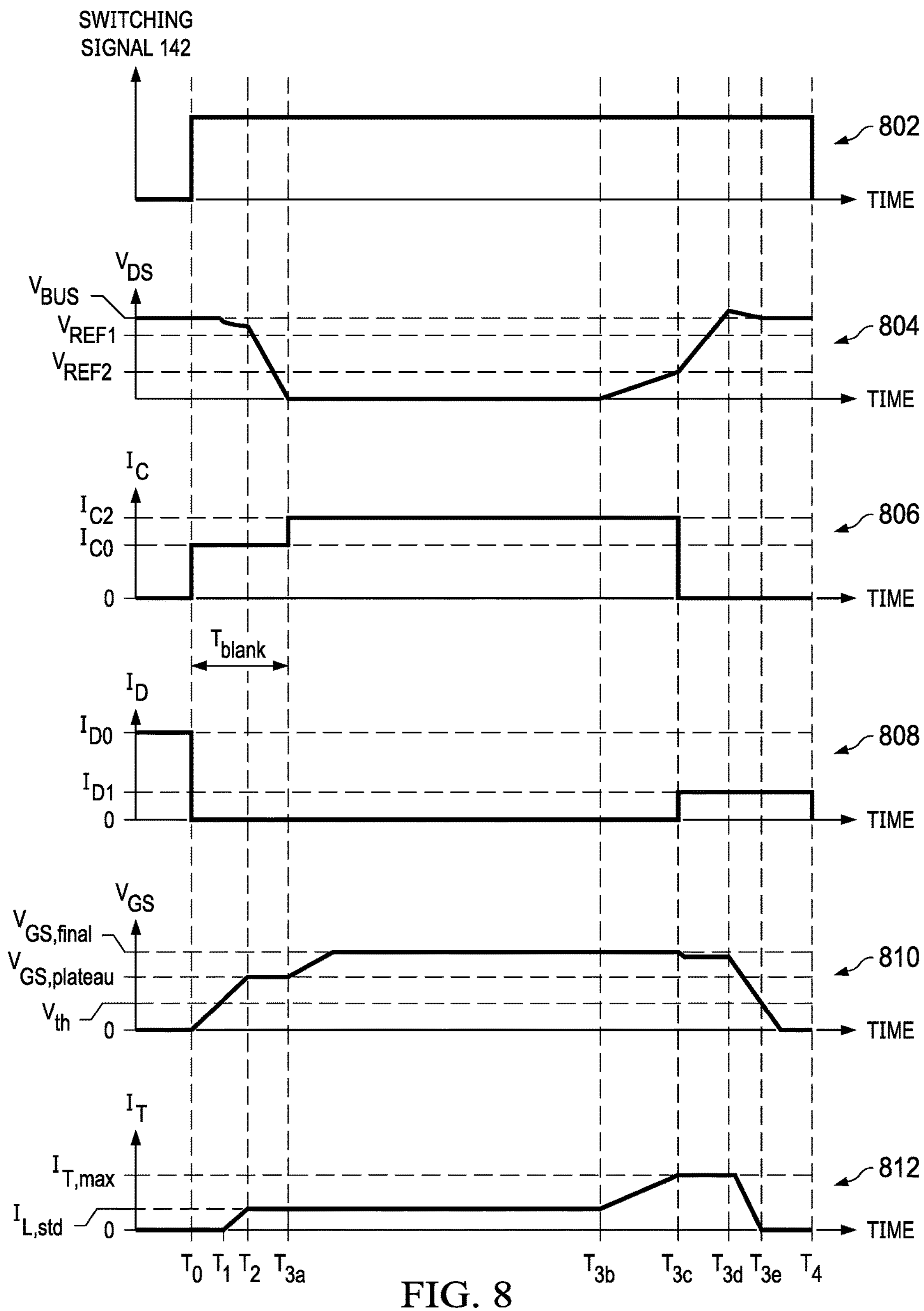

FIG. 8 includes waveform graphs that illustrate example operations of system 700 in modulating charge current 530 and discharge current 532 for transistor 112 in an overcurrent (OC) condition. FIG. 8 includes graphs 802, 804, 806, 808, 810, and 812. Graph 802 illustrates the time variation of switching signal 142. Graph 804 illustrates the time variation of the $V_{DS}$ voltage between current terminals 126 and 128. Graph 806 illustrates the time variation of charge current 530 (labelled $I_C$ in FIG. 8), and graph 808 illustrates the time variation of discharge current 532 (labelled $I_D$ in FIG. 8). Also, graph 810 illustrates the time variation of the $V_{GS}$ voltage between control terminal 124 and current terminal 128, and graph 812 illustrates the time variation of the transistor current $I_T$ conducted by transistor 112.

Before time $T_0$, switching signal 142 has a first state (e.g., a logical zero) indicating a negative period. Responsive to switching signal 142 having the first state, control circuit 514 can provide charge signal 546 to disable charge current source 520, and charge current 530 can be at zero. Also, control circuit 514 can also provide discharge signal 548 including a first digital value, and discharge current source 724 can provide a discharge current 532 having a magnitude of $I_{D0}$ corresponding to the first digital value to discharge control terminal 124 and to disable transistor 112. As transistor 112 is disabled, and the voltage of current terminal 126 (or $V_{DS}$) can also have the $V_{BUS}$ voltage.

At time $T_0$, responsive to switching signal 142 transitioning from the first state to the second state, control circuit 514 can provide discharge signal 548 to disable discharge current source 524, and discharge current 532 can be at zero. Also, control circuit 514 can provide charge signal 546 to charge current source 520. Responsive to charge signal 546, charge current source 520 can provide a charge current 530 having a magnitude of $I_{C0}$ (or $I_{C1}$) to charge the parasitic capacitances of control terminal 124. Processing circuit 512 can also start a timer responsive to the transition of switching signal 142. The timer can expire after a blanking time $T_{blank}$ has expired.

The $V_{GS}$ voltage starts increasing at $T_0$ and reaches the threshold voltage $V_{th}$ at time $T_1$. Between $T_1$ and $T_{2n}$ is the dI/dt phase where transistor 112 conducts the current $I_T$, and the current $I_T$ increases with $V_{GS}$, until $V_{GS}$ reaches $V_{GS,plateau}$ at time $T_2$. System 500 can provide a charge current of $I_{C0}$ (shown in FIG. 8) or $I_{C1}$ to charge control terminal 124 during the dI/dt phase. The transistor current $I_T$ also increases above the current rating ($I_{T,max}$) due to the short circuit condition.

Between $T_2$ and $T_{3a}$ is the dV/dt phase, where the $V_{DS}$ voltage of transistor 112 drops from $V_{BUS}$ (or $V_{BUS'}$) to a value close to zero (based on the on-resistance of transistor 112 and $I_{L\_max\_norm}$). Control circuit 514 can control charge current source 520 to provide a charge current 530 having a magnitude of $I_{C0}$ to control terminal 124.

In FIG. 8, the blanking time $T_{blank}$ ends at time $T_{3a}$, and the timer expires. Responsive to the expiration of the timer, processing circuit 512 can compare sensing result signal 542 with reference voltage $V_{REF1}$ to generate processing result signal 544. Based on processing result signal 544 indicating that $V_{DS}$ is below $V_{REF1}$, control circuit 514 can determine that short circuit condition does not occur and can continue disabling discharge current source 524. Also, control circuit 514 can control charge current source 520 to provide a charge current 530 having a magnitude of $I_{C2}$ to control terminal 124 to shorten the time for the $V_{GS}$ voltage to reach $V_{GS\_final}$, while the transistor current $I_T$ can be equal to steady-state load current value at $I_{L,std}$.

Starting from $T_{3a}$ till the end of the positive period of switching signal 142 (at $T_4$), processing circuit 512 can monitor for an overcurrent condition by comparing sensing result signal 542 with a reference voltage $V_{REF2}$. $V_{REF2}$ can represent the voltage of current terminal 126 (or $V_{DS}$) in an overcurrent condition and can be a lower voltage than $V_{REF1}$.

At time $T_{3b}$ an overcurrent event occurs, and the transistor current $I_T$ starts rising from $I_{L,std}$. The transistor current reaches current rating $I_{T,max}$ at $T_{3c}$. The voltage of current terminal 126 (or $V_{DS}$) also starts rising at $T_{3c}$ with the transistor current, and reaches the reference voltage $V_{REF2}$ at time $T_{3c}$.

At time $T_{3c}$, responsive to detecting that the $V_{DS}$ voltage increases above $V_{REF2}$, control circuit 514 can provide charge signal 546 to disable charge current source 520, and charge current 530 ($I_C$) can become zero. Also, control circuit 514 can provide discharge signal 548 to discharge current source 524, which can provide discharge current 532 to discharge control terminal 124 to disable transistor 112. To perform a soft discharge operation, control circuit 514 can provide discharge signal 748 including a second digital value lower than the first digital value included in the discharge signal before $T_0$, and discharge current source 524 can provide a discharge current 732 having a reduced magnitude of $I_{D1}$ lower than ho provided before $T_0$.

Between $T_{3c}$ and $T_{3d}$, as control terminal 124 is discharged by discharge current 532, the $V_{GS}$ voltage starts dropping at time $T_{3c}$ and reaches a plateau value. The $V_{DS}$ voltage also slews from $V_{REF2}$ to $V_{BUS}$.

Between $T_{3d}$ and $T_{3e}$, as control terminal 124 continues to be discharged by discharge current 532, $V_{GS}$ voltage drops again and drops below the threshold voltage $V_{th}$ at time $T_{3e}$. The transistor current $I_T$ also drops with the $V_{GS}$ voltage and reaches zero at time $T_{3e}$. As transistor 112 (of low-side switch 108) and high-side switch 106 are both disabled at $T_{3e}$, the voltage at current terminal 126 can stay at $V_{BUS}$ at $T_4$.

Figure 9:
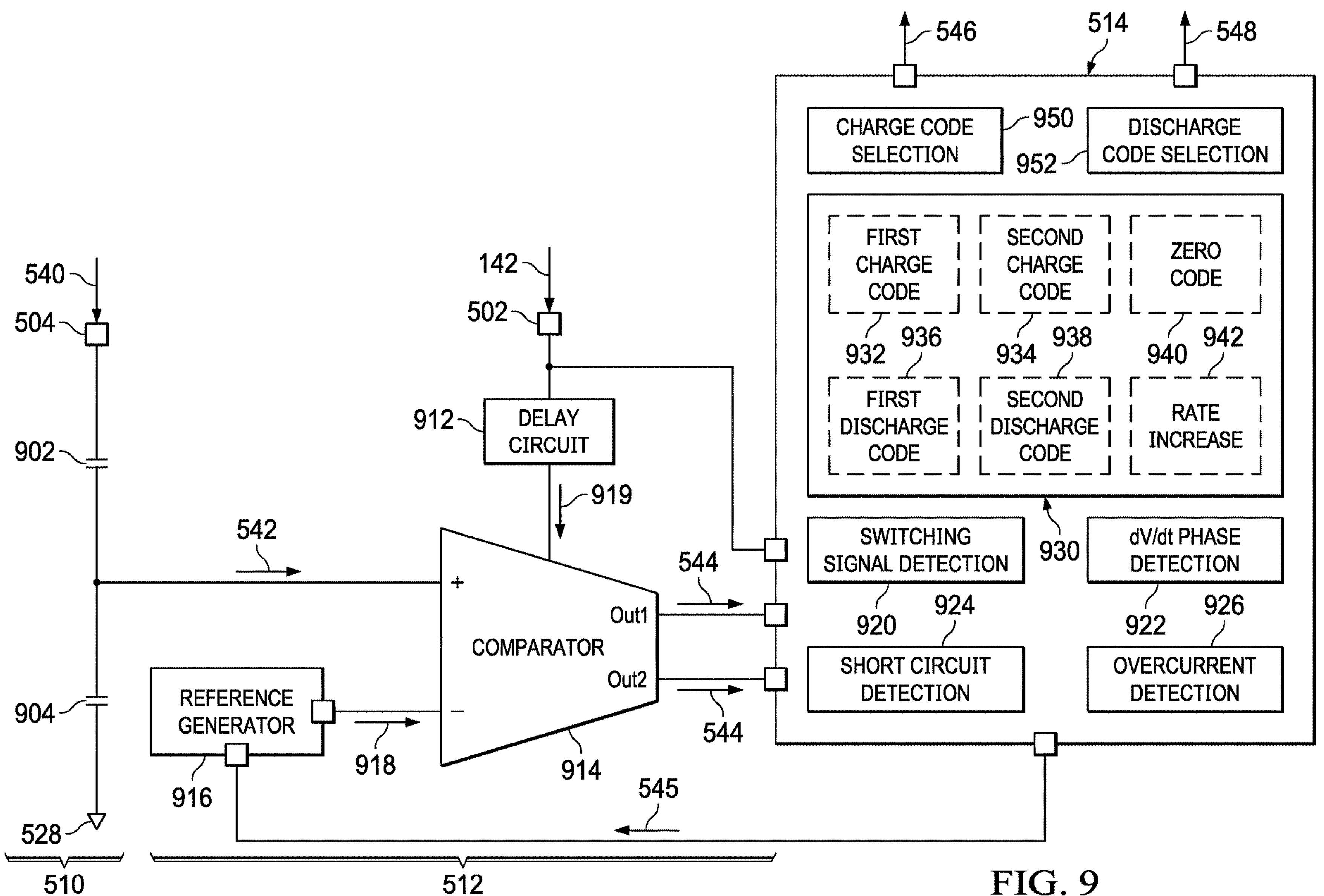
FIGS. 9 through 13 include schematics of example internal components of the system of FIG. 5.

FIG. 9 is a schematic diagram illustrating example internal components of sensing circuit 510, processing circuit 512, and control circuit 514. Referring to FIG. 9, sensing circuit 510 can include a capacitive divider including a capacitor 902 and a capacitor 904 coupled in series between voltage sensing terminal 504 (and current terminal 126 of transistor 112) and a voltage source (e.g., a ground 528), and the capacitive divider can provide a scaled down version of voltage signal 540 as sensing result signal 542. The use of capacitive divider to divide voltage signal 540 can reduce the magnitude of sensing result signal 542, which can reduce voltage stress on processing circuit 512. Also, the capacitive divider can generate sensing result signal 542 from a varying voltage signal 540, while blocking a static direct current (DC) voltage. Accordingly, the capacitive divider does not conduct DC current, which can reduce the overall power consumption of system 500.

Also, processing circuit 512 can include a delay circuit 912, comparator circuits 914, and a reference generator circuit 916. Comparator circuits 914 can have a first input (e.g., a positive input) coupled to sensing circuit 510 to receive sensing result signal 542, and a second input (e.g., a negative input) coupled to reference generator circuit 916 to receive a reference voltage signal 918. Comparator circuits 914 can generate processing result signal 544 by comparing between sensing result signal 542 and reference voltage signal 918. Also, delay circuit 912 can generate a trigger signal 919 by delaying switching signal 142 by the blanking time $T_{blank}$, so comparator circuits 914 can perform the comparison after a duration of $T_{blank}$ has elapsed from the transition of switching signal 142. Further, reference generator circuit 916 can receive control signal 545 from control circuit 514, and can provide a voltage (e.g., $V_{REF0}$, $V_{REF0}'$ $V_{REF1}$, or $V_{REF2}$) as reference voltage signal 918 to comparator circuits 914 based on control signal 545. In some examples, reference generator circuit 916 can include one or more programmable voltage generation circuits that can be programmed by control signal 545 to generate reference voltage signal 918.

Figure 10:
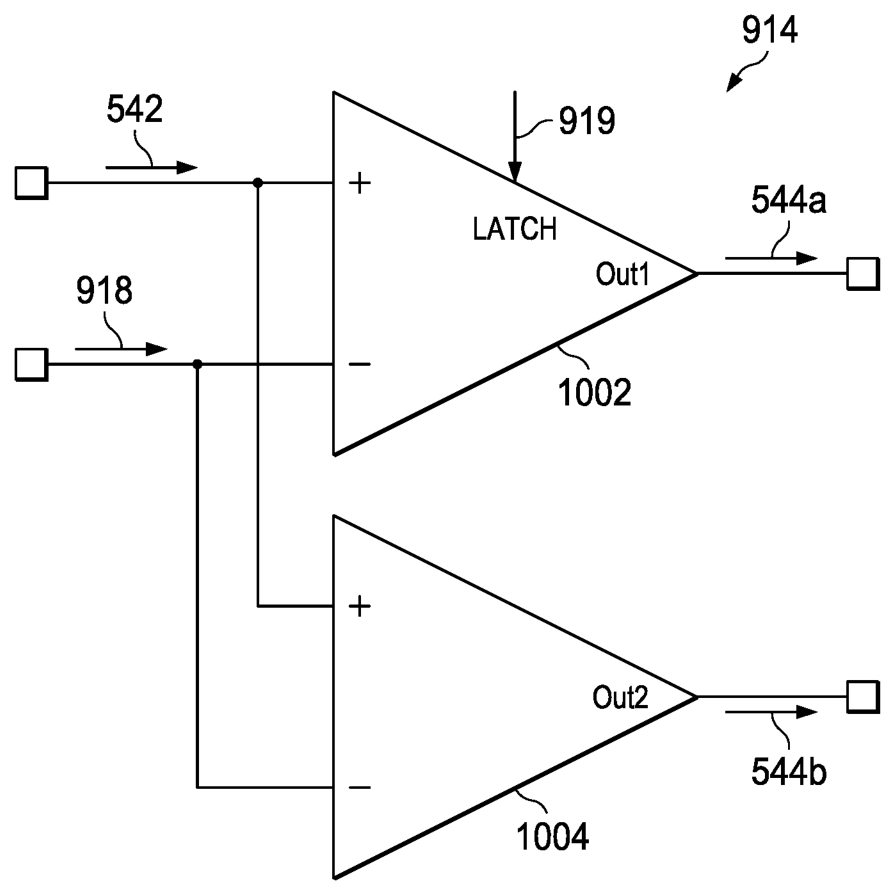

FIG. 10 is a schematic diagram illustrating example internal components of comparator circuits 914. Referring to FIG. 10, comparator circuits 914 can include a comparator 1002 and a comparator 1004. The positive input of each of comparators 1002 and 1004 can receive sensing result signal 542, and the negative input of each comparator can receive reference voltage signal 918. Comparator 1002 can include circuitry that can wait for a pre-determined delay time (e.g., blanking time $T_{blank}$) before performing the comparison between sensing result signal 542 and one of $V_{REF1}$ or $V_{REF2}$ voltages to generate processing result signal 544*a*. Processing result signal 544*a* can indicate whether a short circuit condition or an overcurrent condition is detected. In some examples, comparator 1002 can include a track-and-latch comparator that waits until detecting a transition of trigger signal 919 at the latch input, and then perform the comparison to generate processing result signal 544*a*.

Also, comparator 1004 can perform comparisons between sensing result signal 542 and reference voltage signal 918 to generate processing result signal 544*b* indicating whether transistor 112 operates in the dI/dt phase, in the dV/dt phase, or after dV/dt phase ends, which allows control circuit 514 to select different charge codes to provide charge currents 530 of different magnitudes (e.g., $I_{C0}$, $I_{C1}$, and $I_{C2}$) for the different phases. For example, comparator 1004 can compare between sensing result signal 542 and $V_{REF0}$ to determine whether dI/dt phase has ended or dV/dt phase has started. Comparator 1004 can also compare between sensing result signal 542 and $V_{REF0}'$ to generate processing result signal 544*b* indicating that the dV/dt phase has ended.

Referring gain to FIG. 9, control circuit 514 can include a switching signal detection circuit 920, a dV/dt phase detection circuit 922, a short circuit detection circuit 924, and an overcurrent detection circuit 926. Control circuit 514 can include a memory 930 (e.g., registers, a static random access memory (SRAM), or an off-chip memory) to store a first charge code 932, a second charge code 934, a first discharge code 936, a second discharge code 938, and a zero code 940. Memory 930 can receive the codes from an external system as part of programming information and/or from other components of control circuit 514. Control circuit 514 can also include a charge code selection circuit 950 to provide charge signal 546 by selecting one of first charge code 932, second charge code 934, and zero code 940. Referring again to FIG. 6, first charge code 932 can correspond to a charge current magnitude of $I_{C1}$, and second charge code 934 can correspond to a charge current magnitude of $I_{C0}$. Memory 930 may also store a third charge code (not shown) corresponding to a charge current magnitude of $I_{C2}$. Control circuit 514 can also include a discharge code selection circuit 952 to provide discharge signal 548 by selecting one of first discharge code 936, second discharge code 938, or zero code 940. Referring again to FIGS. 7 and 8, first discharge code 936 can correspond to a discharge current magnitude of ho, and second discharge code 938 can correspond to a discharge current magnitude of $I_{D1}$. Zero code 940 can correspond to a zero charge current and a zero discharge current. Both charge code selection circuit 950 and discharge code selection circuit 952 can be controlled by one of switching signal detection circuit 920, dV/dt phase detection circuit 922, short circuit detection circuit 924, or overcurrent detection circuit 926.

Specifically, switching signal detection circuit 920 can receive switching signal 142 and determine whether the switching signal 142 is in the start of a positive period or in a negative period of a cycle. If switching signal 142 is in the negative period (e.g., the switching signal 142 having the first state), switching signal detection circuit 920 can control charge code selection circuit 950 to provide charge signal 546 by selecting zero code 940, and control discharge code selection circuit 952 to provide discharge signal 548 by selecting first discharge code 936 (corresponding to $I_{D0}$). If a transition of switching signal 142 from the first state to the second state is detected, switching signal detection circuit 920 can control charge code selection circuit 950 to provide charge signal 546 by selecting first charge code 932 (corresponding to $I_{C1}$), and control discharge code selection circuit 952 to provide discharge signal 748 by selecting zero code 1140. Switching signal detection circuit 920 can then hand the control of charge signal 746 and discharge signal 748 to dV/dt phase detection circuit 922. Switching signal detection circuit 920 can also provide control signal 545 to reference generator circuit 916 to select $V_{REF0}$ as reference voltage signal 918.

The dV/dt phase detection circuit 922 can receive processing result signal 544*b* from comparator 1004 representing a comparison between sensing result signal 542 (representing $V_{DS}$) and reference voltage signal 918 (representing $V_{REF0}$), and determine whether $V_{DS}$ falls below $V_{REF0}$ from a state of processing result signal 544*b*. Referring again to FIG. 6, if $V_{DS}$ is above $V_{REF0}$, which can indicate that dV/dt phase has not yet started, dV/dt phase detection circuit 922 can control charge code selection circuit 950 to provide charge signal 746 by selecting first charge code 932. If $V_{DS}$ reaches or is below $V_{REF0}$, which indicates that the dV/dt phase has started, dV/dt phase detection circuit 922 can control charge code selection circuit 950 to provide charge signal 546 by selecting second charge code 934. In some examples, dV/dt phase detection circuit 922 can also provide control signal 545 to reference generator circuit 916 to select $V_{REF0}'$ as reference voltage signal 918, and comparator 1004 can compare sensing result signal 542 with $V_{REF0}'$ to generate processing result signal 544*b*. If processing result signal 544*b* indicates that the dV/dt phase has ended, dV/dt phase detection circuit 922 can control charge code selection circuit 950 to provide charge signal 746 by selecting a third charge code corresponding to Ica, or second charge code 934 corresponding to $I_{C0}$, Also, short circuit detection circuit 924 and overcurrent detection circuit 926 can perform the respective short circuit and overcurrent conditions detection operations. The detection operations can be performed based on processing result signal 544*a* from comparator 1002, which can compare sensing result signal 542 with reference voltage signal 918 ($V_{REF1}$ or $V_{REF2}$) after the blanking time $T_{blank}$ has elapsed from the transition of switching signal 142. The detection operations by short circuit detection circuit 924 and overcurrent detection circuit 926 can be performed in parallel with the detection operations by dV/dt phase detection circuit 922. In a case where a short circuit condition or an overcurrent circuit condition is detected, one of short circuit detection circuit 924 or overcurrent detection circuit 926 can override the charge code and discharge code selected by dV/dt phase detection circuit 922 to disable transistor 212.

Short circuit detection circuit 924 can receive processing result signal 544*a* from comparator 1002 representing a comparison between sensing result signal 542 (representing $V_{DS}$) and reference voltage signal 918 (representing $V_{REF1}$), and determine whether $V_{DS}$ is above $V_{REF1}$ from a state of processing result signal 544*a*. Referring again to FIG. 7, if $V_{DS}$ is above $V_{REF1}$ after the blanking time $T_{blank}$ has elapsed from the transition of switching signal 142, short circuit detection circuit 924 can detect that a short circuit condition has occurred. Responsive to the detection of the short circuit condition, short circuit detection circuit 924 can control charge code selection circuit 950 to provide charge signal 546 by selecting zero code 940, and control discharge code selection circuit 952 to provide discharge signal 548 by selecting second discharge code 938 to perform a soft discharge operation. But if $V_{DS}$ is below $V_{REF1}$, which indicate there is no short circuit condition, short circuit detection circuit 924 can hand the control of charge signal 546 and discharge signal 548 to overcurrent detection circuit 926, and provide control signal 545 to reference generator circuit 916 to select $V_{REF2}$ as the reference voltage signal 918.

Overcurrent detection circuit 926 can receive processing result signal 544*a* from comparator 1002 representing a comparison between sensing result signal 542 (representing $V_{DS}$) and reference voltage signal 918 (representing $V_{REF2}$) during the rest of the positive period, and determine whether $V_{DS}$ is above $V_{REF2}$ from a state of processing result signal 544*a*. Referring back to FIG. 8, if $V_{DS}$ is above $V_{REF2}$, overcurrent detection circuit 926 can detect that an overcurrent condition has occurred. Responsive to the detection of the overcurrent condition, overcurrent detection circuit 926 can control charge code selection circuit 950 to provide charge signal 546 by selecting zero code 940, and control discharge code selection circuit 952 to provide discharge signal 548 by selecting second discharge code 938 to perform a soft discharge operation. But if $V_{DS}$ is below $V_{REF2}$, overcurrent detection circuit 926 can allow dV/dt phase detection circuit 922 to set the charge code and discharge code.

As described above, system 500 can determine the magnitude of charge current 530 during the dV/dt phase, which corresponds to second charge code 934 for a target rate of decrease of $V_{DS}$, using a feedback loop. System 500 can also determine the magnitude of charge current 530 during the dI/dt phase, which corresponds to first charge code 932, using the same feedback loop but with an increased target rate of decrease of $V_{DS}$ (e.g., a 10% increase). System 500 can store first charge code 932 and second charge code 934 in memory 930.

Figure 11:
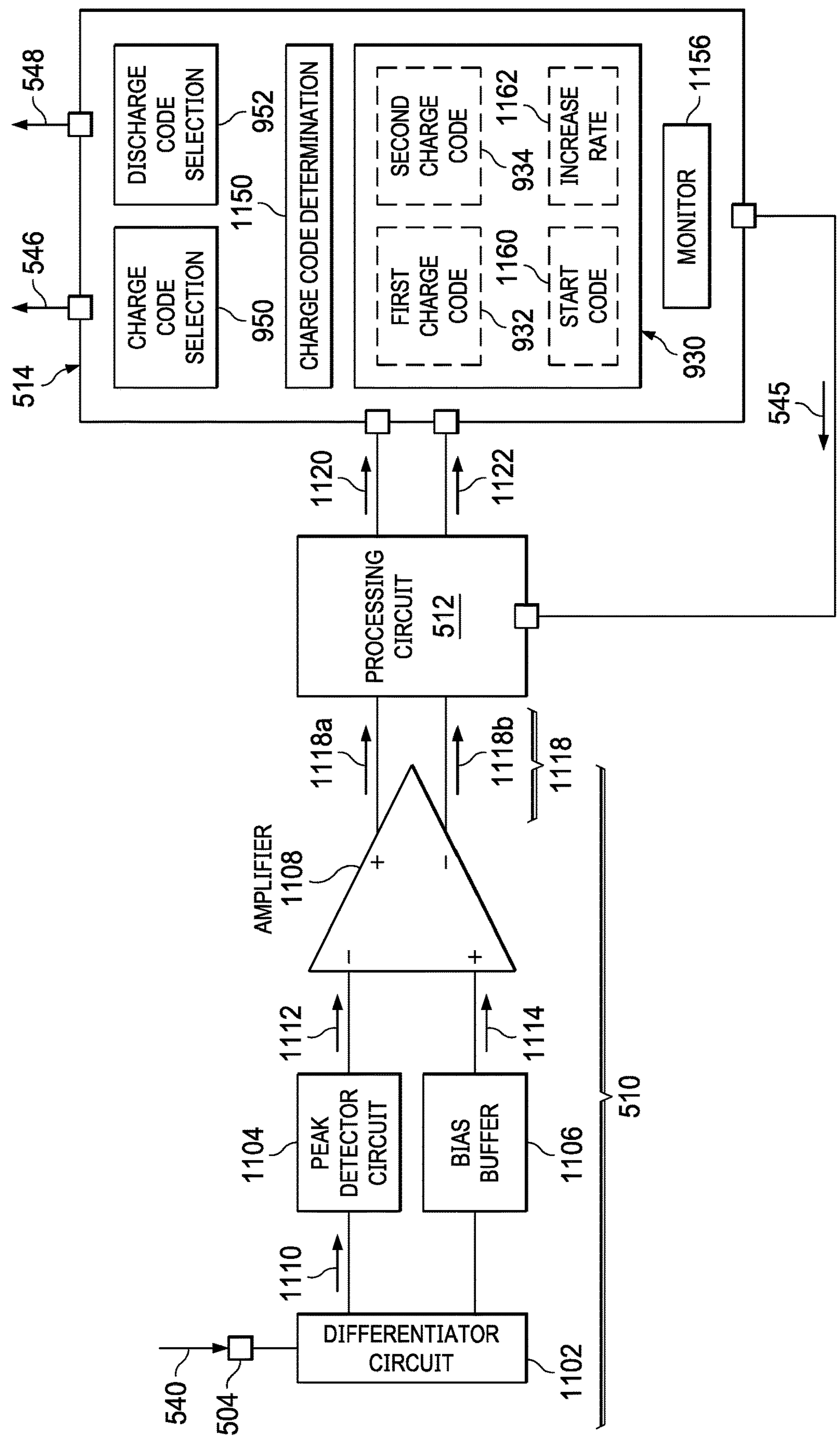
Figure 12:
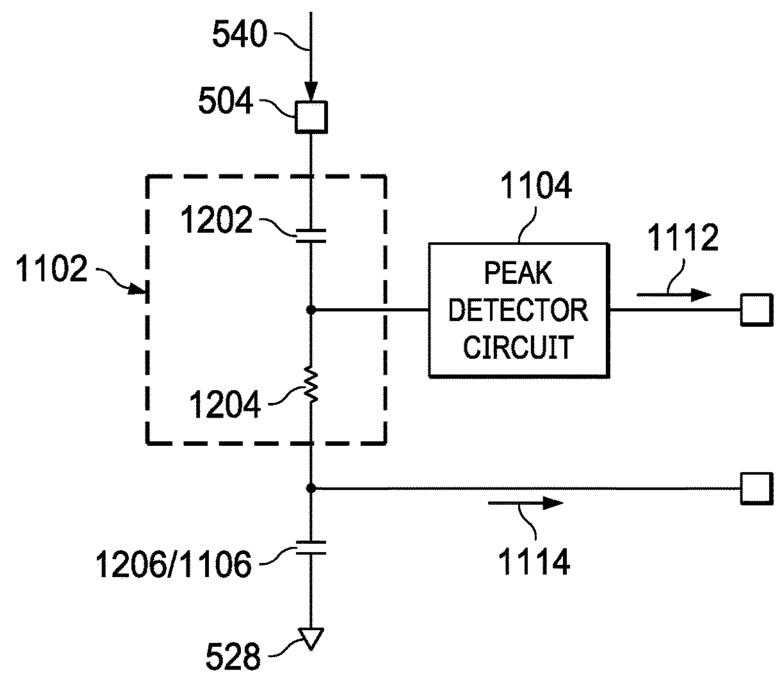
Figure 13:
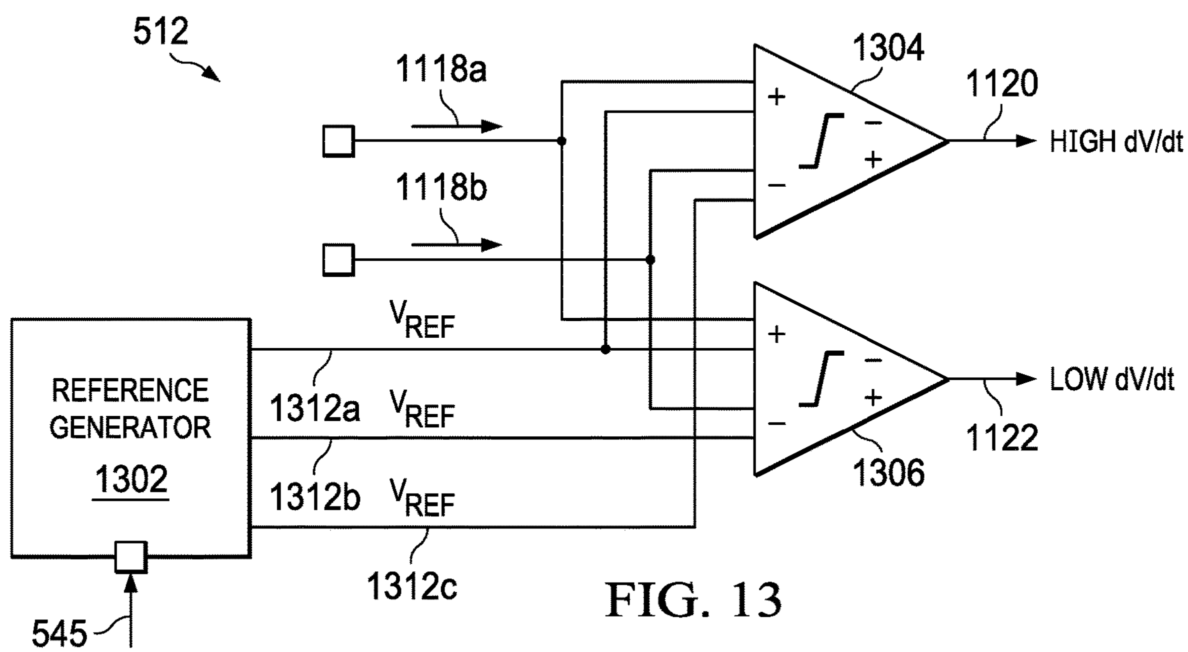

FIGS. 11-13 are schematic diagrams illustrating example internal components of sensing circuit 510, processing circuit 512, and control circuit 514 to implement feedback loops for determining first charge code 932 and second charge code 934. Referring to FIG. 11, sensing circuit 510 can include circuits to measure the dV/dt rate of voltage signal 540, including a differentiator circuit 1102, a peak detector circuit 1104, a bias buffer 1106, and a differential amplifier 1108.

FIG. 12 illustrates example internal components of differentiator circuit 1102 and bias buffer 1106. Referring to FIG. 12, differentiator circuit 1102 can include a series combination of a capacitor 1202 and a resistor 1204, and can provide a voltage signal 1110 representing a rate of decrease of voltage signal 540 (dV/dt).

Also, peak detector circuit 1104 can provide a voltage signal 1112 representing the peak dV/dt rate. Bias buffer 1106 can be coupled between differentiator circuit 1102 and a voltage source (e.g., a ground) to provide a voltage signal 1114. Voltage signal 1114 can represent a common mode voltage for amplifier 1208. Bias buffer 1106 can also provide the charge for the capacitor of differentiator circuit 1102. In some examples, bias buffer 1106 can include a capacitor 1206 coupled between resistor 1204 and a ground (e.g., ground 528). In FIG. 12, if capacitor 1202 has a capacitance $C_{diff}$ and resistor 1204 has a resistance $R_{diff}$, differentiator circuit 1102 can provide a voltage signal 1110 based on the following Equation, where dV/dt represents the rate of decrease of voltage signal 540 and $V_{1114}$ represents voltage signal 1114 provided by bias buffer 1106:

$$V_{1110}(t) = V_{111}(t) + R_{diff} C_{diff}\left(\frac{dV}{dt}\right) \quad \text{(Equation 1)}$$

Referring again to FIG. 11, differential amplifier 1108 can generate differential voltage signals 1118*a* and 1118*b* representing a difference between voltage signals 1112 and 1114, and provide differential voltage signals 1118*a* and 1118*b* as sensing result signal 542. Voltage signal 1118*a* can represent a positive difference between voltage signals 1112 and 1114, and voltage signal 1118*b* can represent a negative difference between voltage signals 1112 and 1114. For example, the voltage signal 1118*a* ($V_{1118a}$) and 1118*b* ($V_{1118b}$) can be related to voltage signals 1112 ($V_{1112}$) and 1114 ($V_{1114}$), and an output common mode voltage $V_{o,cm}$, based on the following Equations:

$$V_{1118a} = V_{o,cm} + 0.5(V_{1114} - V_{1112}) \quad \text{(Equation 2)}$$

$$V_{1118b} = V_{o,cm} - 0.5(V_{1114} - V_{1112}) \quad \text{(Equation 3)}$$

Also, processing circuit 512 can compare differential voltage signals 1118 with thresholds representing a target dV/dt rate and generate, as part of processing result signal 544, a dV/dt high indication signal 1120 and a dV/dt low indication signal 1122. An asserted dV/dt high indication signal 1120 can indicate that the dV/dt rate of voltage signal 740 is above the target dV/dt rate, and an asserted dV/dt low indication signal 1122 can indicate that the dV/dt rate of voltage signal 540 is below the target dV/dt rate. In some examples, the thresholds can represent a first target dV/dt rate for the dV/dt phase and a second target dV/dt rate for the dI/dt phase, and a combination of dV/dt high indication signal 1120 and dV/dt low indication signal 1122 can indicate whether the dV/dt rate is below the first target dV/dt rate, between the first and second target dV/dt rates, or is above the second target dV/dt rate. As described above, the second target dV/dt rate can be the result of the increased drive strength in the dI/dt phase and can be higher than the first target dV/dt rate. In some examples, processing circuits 512 can first compare differential voltage signals 1118 with a first set of thresholds representing the first target dV/dt rate. If the differential signals indicate that the dV/dt rate exceeds the first target dV/dt rate, processing circuit 512 can then compare differential voltage signals 1118 with a second set of thresholds representing the second target dV/dt rate.

In some examples, sensing circuit 510 and processing circuit 512 can measure the dV/dt rate of voltage signal 540 using a time-based technique. For example, sensing circuit 510 can include a capacitive divider described in FIG. 9 to provide a sensing result signal 542 as a scaled version of voltage signal 540, and processing circuit 512 can measure the time it takes for sensing result signal 542 to fall between two thresholds. Processing circuit 512 can compare the measured time with a target time representing the target dV/dt rate. If the measured time is less than the target time, which can indicate that the dV/dt rate is higher than the target rate, processing circuit 512 can assert dV/dt high indication signal 1120. If the measured time is larger than the target time, which can indicate that the dV/dt rate is lower than the target rate, processing circuit 512 can assert dV/dt low indication signal 1122.

Control circuit 514 can include a charge code determination circuit 1150 and a monitor circuit 1156. Also, memory 930 can store a start code 1160 and an increase rate code 1162 to support the feedback loop. Charge code determination circuit 1150 can determine first charge code 932 and second charge code 934 by implementing a feedback loop and based on the states of dV/dt high indication signal 1120 and dV/dt low indication signal 1122. Also, increase rate code 1162 can indicate a relationship between the first target rate in the dV/dt phase and the second target rate in the dI/dt phase (e.g., 10% increase). Control circuit 514 can provide control signal 545 including increase rate code 1162 to processing circuit 512, which can set the thresholds for comparing differential voltage signals 1118*a*/1118*b* based on increase rate code 1162.

Specifically, as part of a feedback loop operation, charge code determination circuit 1150 can provide charge signal 546 including start code 1160 in both the dV/dt phase and the dI/dt phase of a first switching cycle. Charge code determination circuit 1150 can receive dV/dt high indication signal 1120 and dV/dt low indication signal 1122 and update start code 1160 based on the states of the indication signals. For example, if dV/dt high indication signal 1120 is deasserted and dV/dt low indication signal 1122 is asserted, charge code determination circuit 1250 can determine that the dV/dt rate of voltage signal 540 is below a target dV/dt rate for the dV/dt phase, and increment start code 1160 by an offset. Charge code selection circuit 950 can then generate charge signal 546 for the next switching cycle based on the updated initial code to increase charge current 530 and the dV/dt rate of voltage signal 540.

Charge code determination circuit 1150 can continue incrementing start code 1160 by the offset in subsequent switching cycles until the dV/dt rate of voltage signal 740 reaches to a first target dV/dt rate (of the dV/dt phase). Charge code determination circuit 1150 can determine that the dV/dt rate of voltage signal 540 reaches the first target dV/dt rate based on both dV/dt high indication signal 1120 and dV/dt low indication signal 1122 being deasserted. Charge code determination circuit 1150 can then stop updating start code 1160, and store the most recent start code 1160 as second charge code 934 in memory 930.

Charge code determination circuit 1150 can then continue incrementing start code 1160 by the same offset, or by a different offset, and provide charge signal 546 including the incremented start code to increase the dV/dt rate of voltage signal 540. The feedback loop operation can end when the dV/dt rate of voltage signal 540 reaches the second target dV/dt rate, which can be 10% (or any percentage) higher than the first target dV/dt rate according to increase rate code 1162. Charge code determination circuit 1150 can then stop updating start code 1160, and store the most recent start code 1160 as first charge code 932 in memory 930.

In some examples, processing circuit 512 can compare differential voltage signals 1118*a/b* with the a set of thresholds representing both the first and second dV/dt rates. Charge code determination circuit 1150 can determine that the dV/dt rate of voltage signal 740 converges to the second target dV/dt rate based on dV/dt high indication signal 1120 being asserted and dV/dt low indication signal 1122 being deasserted. The different combinations of states of dV/dt high indication signal 1120 and dV/dt low indication signal 1122 allow charge code determination circuit 1150 to distinguish between the convergence to the first target dV/dt rate and the convergence to the second target dV/dt rate. In some examples, charge code determination circuit 1150 can provide control signal 545 to processing circuit 512. In response, processing circuit 512 can compare differential voltage signals 1118*a/b* with a second set of thresholds representing the second target dV/dt rate to generate dV/dt high indication signal 1120 and dV/dt low indication signal 1122, which can then be used by charge code determination circuit 1150 to detect the convergence to the second target dV/dt rate.

Also, monitor circuit 1156 can the monitor the dV/dt rate of voltage signal 740, and then start the feedback loop to update first charge code 932 and second charge code 934 based on the monitoring result. For example, if monitor circuit 1156 receives asserted dV/dt high indication signal 1120 or asserted dV/dt low indication signal 1122 across multiple consecutive switching cycles, which can indicate that the dV/dt rate of voltage signal 540 deviates from the target dV/dt rate. There can be various reasons for the deviation, such as temperature change, aging, and changes in the operation condition. Monitor circuit 1156 can also monitor the dV/dt rate on a regular basis to detect variations from the target rates, and restart the feedback loop operations if such variations are detected.

FIG. 13 is a schematic diagram that illustrates example internal components of processing circuit 512 of FIG. 11. Referring to FIG. 13, processing circuit 512 can include a reference generator 1302, a comparator 1304, and a comparator 1306. In some examples, both comparators can be resettable and can remain in a reset state until a difference between differential voltage signals 1118*a* and 1118*b* exceeds a threshold. Reference generator 1302 can provide reference voltages $V_{REF}$ 1312*a*, $V_{REF}$ 1312*b*, and $V_{REF}$ 1312*c*. The reference voltages $V_{REF}$ 1312*a*, $V_{REF}$ 1312*b*, and $V_{REF}$ 1312*c* can represent target dV/dt rates of the dV/dt phase and the dI/dt phase, and can be defined based on the following Equations:

$$V_{REF1312a}=V_{o,cm}+0.5(V_{DVDT}-VT_{PD}) \quad \text{(Equation 4)}$$

$$V_{REF1312b}=V_{o,cm}-0.5(V_{DVDT}-VT_{PD}) \quad \text{(Equation 5)}$$

$$V_{REF1312c}=V_{o,cm}-0.5(V_{DVDT}-VT_{PD})-0.5\times V_{DVDT} \quad \text{(Equation 6)}$$

In Equations 4, 5, and 6, $V_{o,cm}$ can represent the output common mode voltage of differential amplifier 1108, $V_{DVDT}$ can represent a reference voltage provided by differentiator circuit 1102 for voltage signal 540 having the target dV/dt rate, and x represents a percentage increase of the target dV/dt rate during the dI/dt phase (e.g., 10%) and can be based on increase rate code 1162 provided by control signal 545.

Also, $VT_{PD}$ can represent a voltage drop in the peak detector output. In some examples, peak detector circuit 1104 can include a source follower. When there is a 1V drop and recovery at the input of the peak detector (relative to some bias), and if $VT_{PD}$ is 0.6V, the output of the peak detector can be 0.4V below the same bias. To compensate for such voltage drops, the same VTPD voltage can be subtracted from the reference voltages $V_{REF}$ 1312*a*, $V_{REF}$ 1312*b*, and $V_{REF}$ 1312*c*.

Comparators 1304 and 1306 can be configured as hysteric comparators and can perform comparison operations involving signals 1218*a* and 1218*b* and $V_{REF}$ 1312*a* and $V_{REF}$ 1312*c* to generate dV/dt high indication signal 1220. Also, comparator 1306 can perform comparison operations involving signals 1218*a* and 1218*b* and $V_{REF}$ 1312*a* and $V_{REF}$ 1312*b* to generate dV/dt low indication signal 1222.

Comparator 1304 can include subtraction circuits to perform a subtraction between voltage signal 1118*a* and $V_{REF}$ 1312*a* to generate an internal signal 1314*a*, and to perform a subtraction between voltage signal 1118*b* and $V_{REF}$ 1312*c* to generate an internal signal 1314*b*, based on the following Equations:

$$V_{1314a}=V_{1118a}-V_{REF1312a} \quad \text{(Equation 7)}$$

$$V_{1314b}=V_{1118b}-V_{REF1312c} \quad \text{(Equation 8)}$$

Comparator 1304 can generate an asserted dV/dt high indication signal 1120 if the voltage of internal signal 1314*a* is higher than internal signal 1314*b*, which can indicate that the difference between $V_{1118a}$ and $V_{1118b}$ exceeds the difference between $V_{REF1312a}$ and $V_{REF1312c}$ Otherwise, comparator 1304 can generate a deasserted dV/dt high indication signal 1120.

Also, comparator 1306 can perform a subtraction between voltage signal 1118*a* and $V_{REF}$ 1312*a* to generate an internal signal 1316*a*, and a subtraction between voltage signal 1118*b* and $V_{REF}$ 1312*b* to generate an internal signal 1316*b*, based on the following Equations:

$$V_{1316a}=V_{1118a}-V_{REF1312a} \quad \text{(Equation 9)}$$

$$V_{1316b}=V_{1118b}-V_{REF1312b} \quad \text{(Equation 10)}$$

Comparator 1306 can generate an asserted dV/dt low indication signal 1222 if the voltage of internal signal 1316*a* is higher than internal signal 1316*b*, which can indicate that the difference between $V_{1118a}$ and $V_{1118b}$ is less than the difference between $V_{REF1312a}$ and $V_{REF1312b}$. Otherwise, comparator 1306 can generate a deasserted dV/dt low indication signal 1122.

Figure 14A:
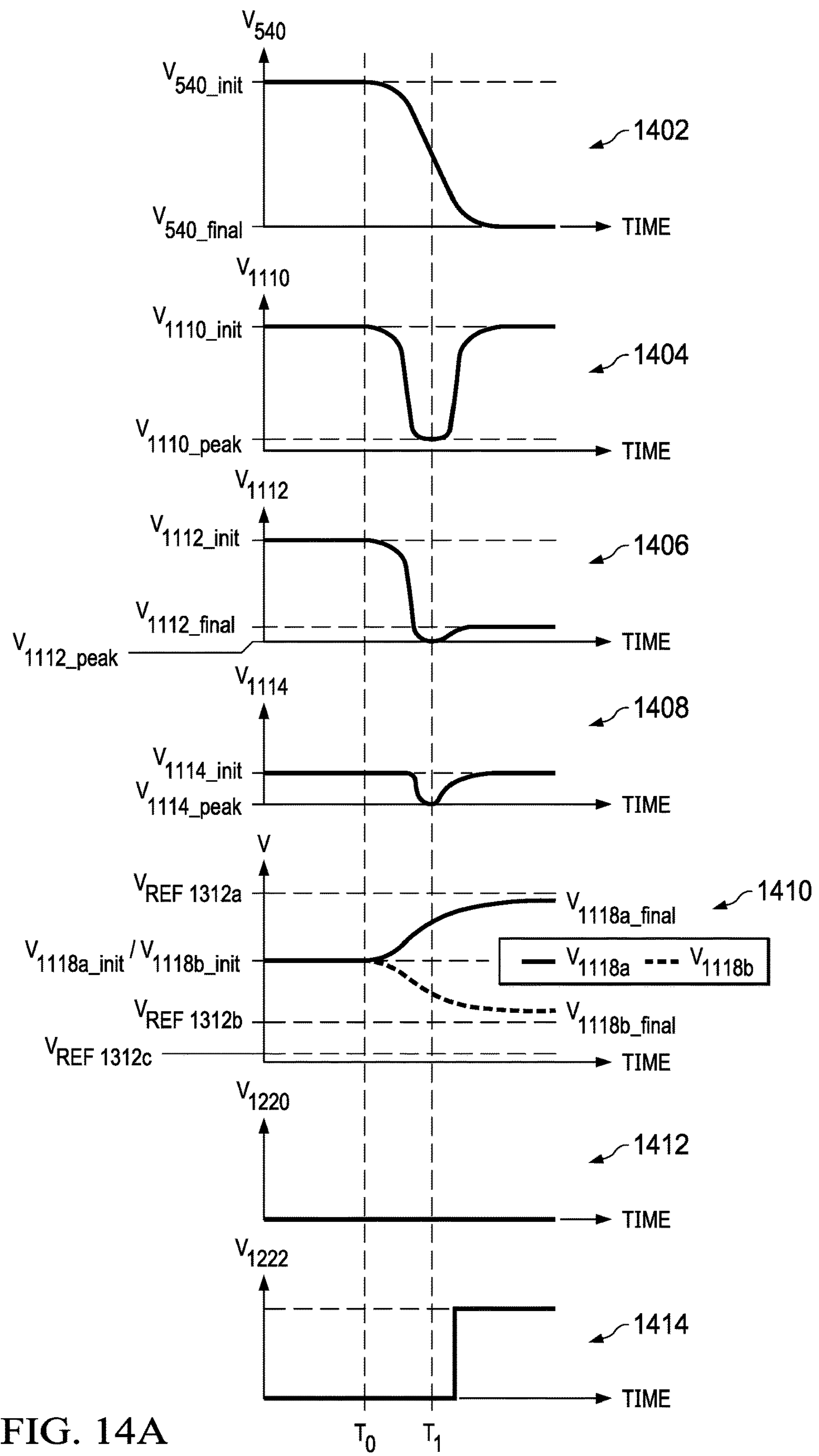
FIGS. 14A and 14B include waveform graphs that illustrate example operations of the internal components of FIGS. 9 through 13.
Figure 14B:
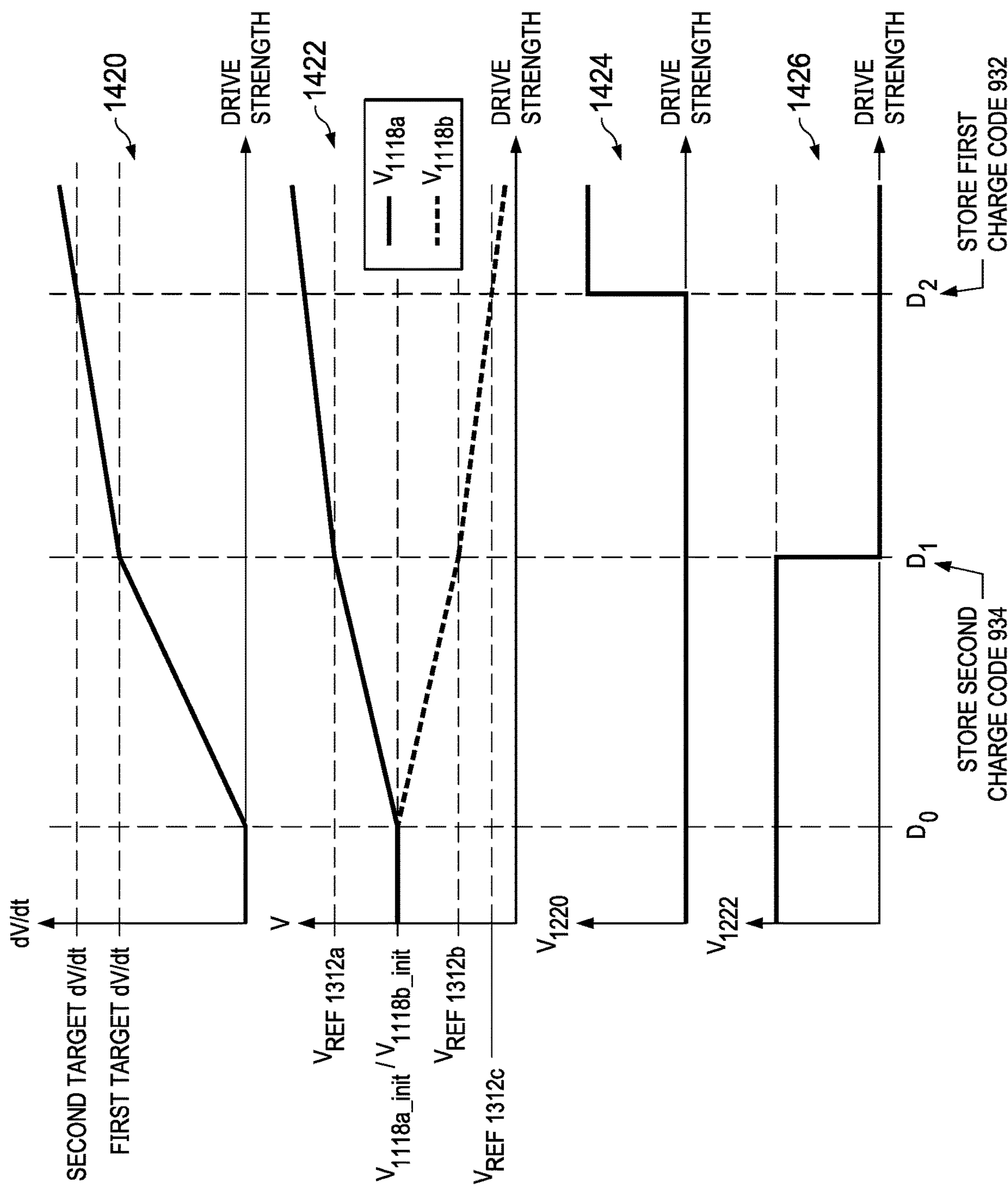

FIG. 14A and FIG. 14B include waveform graphs that illustrate example operations of sensing circuit 510 and processing circuit 512 of FIGS. 11-13. FIG. 14A includes waveform graphs 1402, 1404, 1406, 1408, 1410, 1412, and 1414 that illustrate an example operation where the dV/dt rate is below the first target dV/dt rate for the dV/dt phase. Waveform graph 1402 represents the time variation of an example voltage signal 540 sensed by differentiator circuit 1102, and waveform graph 1404 represents the time variation of voltage signal 1110 provided by differentiator circuit 1102 responsive to voltage signal 540. Also, waveform graph 1406 represents the time variation of voltage signal 1112 provided by peak detector circuit 1104 responsive to voltage signal 1110, and waveform graph 1408 represents the time variation of voltage signal 1114 provided by bias buffer 1106. Also, waveform graph 1410 represents the time variation of differential voltage signals 1118*a* and 1118*b*, and reference voltages $V_{REF}$ 1312*a*, 1312*b*, and 1312*c*. Further, waveform graph 1412 represents the time variation of dV/dt high indication signal 1120, and waveform graph 1414 represents the time variation of dV/dt low indication signal 1122.

Referring to FIG. 14A, at time $T_0$, voltage signal 540 is at $V_{704\_init}$ and has not yet started a transition. Voltage signals 1110, 1112, and 1114 can be at their respective initial value $V_{1110\_init}$, $V_{1112\_init}$, and $V_{1114\_init}$. Voltage signal 1118*a*, which represents an amplification of $V_{1112}-V_{1114}$, can have an initial value $V_{1118a\_init}$, and voltage signal 1118*b*, which represents an amplification of $V_{1114}-V_{1112}$, can have an initial value $V_{1118b\_init}$. $V_{1118a\_init}$ and $V_{1118b\_init}$ can have the same voltage value. Also, both comparators 1304 and 1306 can be in a reset state because the difference between $V_{1118b\_int}$ and $V_{1118a\_init}$ is below a threshold for exiting the reset state. Accordingly, both dV/dt high indication signal 1120 and dV/dt low indication signal 1122 remain deasserted.

After $T_0$, voltage signal 740 starts a transition and decrease from $V_{540\_init}$ to $V_{540\_final}$, and the rate of change (dV/dt) can be at maximum at time $T_1$. Voltage signal 1110 provided by differentiator circuit 1102 can drop from $V_{1110\_init}$ and reach a minimum peak of $V_{1110\_peak}$ at $T_1$. After $T_1$, voltage signal 540 can stop decreasing, and voltage signal 1110 can rise back to $V_{1110\_init}$. Responsive to changes in voltage signal 1110, peak detector circuit 1104 can reduce voltage signal 1112 to $V_{1112\_peak}$ at time $T_1$, and then settle at $V_{1112\_final}$ after $T_1$. The value of $V_{1112\_final}$ can be based on $V_{1112\_peak}$ and $V_{1110\_peak}$. For example, if the peak dV/dt rate of voltage signal 740 increases, $V_{1112\_peak}$ and $V_{1112\_final}$ can decrease to lower voltages than shown in waveform graph 1406, and if peak dV/dt of voltage signal 740 decreases, $V_{1112\_peak}$ and $V_{1112\_final}$ can increase to higher voltages than shown in waveform graph 1406. Also, bias buffer can reduce voltage signal 1114 to $V_{1114\_peak}$ due to coupling from differentiator 1102, and then settle back to $V_{1114\_init}$ after $T_1$.

Differential voltage signals 1118*a* and 1118*b* provided by differential amplifier 1108 also change responsive to changes in voltage signals 1112 and 1114. Referring to waveform graph 1410, voltage signal 1118*a* increases from $V_{1118a\_init}$ to $V_{1118a\_final}$ and voltage signal 1118*b* decreases from $V_{1118b\_init}$ to $V_{1118b\_final}$. Because $V_{1118a\_final}$ is below $V_{REF}$ 1312*a* and $V_{1118b\_final}$ is above $V_{REF}$ 1312*b*, the difference between $V_{1118a\_final}$ and $V_{1118b\_final}$ is below the difference between $V_{REF}$ 1312*a* and $V_{REF}$ 1312*b*, which indicates that the dV/dt rate is lower than the first target dV/dt rate represented by $V_{REF}$ 1312*a* and $V_{REF}$ 1312*b*. Accordingly, at $T_1$, comparator 1306 can provide an asserted dV/dt low indication signal 1122. Also, because $V_{1118b\_final}$ is also above $V_{REF}$ 1312*c*, the difference between $V_{1118a\_final}$ and $V_{1118b\_final}$ is also less than the difference between $V_{REF}$ 1312*a* and $V_{REF}$ 1312*c*, which indicates that the dV/dt rate is also lower than the second target dV/dt rate (e.g., higher than the first target dV/dt rate by 10%) represented by $V_{REF}$ 1312*a* and $V_{REF}$ 1312*c*. Accordingly, comparator 1304 can provide a deasserted dV/dt high indication signal 1120.

FIG. 14B illustrates waveform graphs that illustrate example feedback loop operations of sensing circuit 510 and processing circuit 512 of FIGS. 11-13 in determining first charge code 932 and second charge code 934. FIG. 14B includes waveform graphs 1420, 1422, 1424, 1408, 1410, 1412, and 1414 that illustrate an example operation where the dV/dt rate is below the first target dV/dt rate for the dV/dt phase. Waveform graph 1420 represents the variation of the dV/dt rate of voltage signal 540 as a function of the dV/dt & dI/dt drive strength (represented by the magnitude of charge current during the dV/dt and dI/dt phases), and waveform graph 1422 represents the variation of differential voltage signals 1118*a* and 1118*b*, and reference voltages $V_{REF}$ 1312*a*, 1312*b*, and 1312*c*. Waveform graph 1424 represents the variation of dV/dt high indication signal 1120, and waveform graph 1414 represents the variation of dV/dt low indication signal 1122, each with respect to the drive strength. The drive strength can be adjusted based on incrementing start code 1160.

Prior to drive strength reaching $D_0$, the dV/dt rate can be at zero. Voltage signal 1118*a* can have an initial value $V_{1118a\_init}$ and voltage signal 1118*b* can have an initial value $V_{1118b\_init}$. $V_{1118a\_init}$ and $V_{1118b\_init}$ can have the same voltage value. Also, both comparators 1304 and 1306 can be in a reset state due to the difference between $V_{1118b\_init}$ and $V_{1118a\_init}$ is below a threshold for exiting the reset state. Accordingly, dV/dt high indication signal 1120 is deasserted, while dV/dt low indication signal 1122 is asserted, to indicate that the switching slew rate is below the target value. Charge code determination circuit 1150 can continue incrementing start code 1160 to increase the drive strength.

The dV/dt rate can start increasing when the drive strength reaches at $D_0$. Between $D_0$ and $D_1$, system 500 can increase the dV/dt rate of voltage signal 540 in consecutive switching cycles, and dV/dt rate of voltage signal 540 can increase monotonically between $D_0$ and $D_1$. $V_{1118a}$ increases from $V_{1118a\_init}$ and $V_{1118b}$ decreases from $V_{1118b\_init}$. Before $D_1$, $V_{1118a}$ is below $V_{REF}$ 1312*a* and $V_{1118b}$ is below $V_{REF}$ 1312*b* and $V_{REF}$ 1312*c*. Accordingly, comparator 1306 can provide an asserted dV/dt low indication signal 1122, and comparator 1304 can provide a deasserted dV/dt high indication signal 1120.

When the drive strength equals $D_1$, as the dV/dt rate continues increasing, $V_{1118a}$ rises above $V_{REF}$ 1312*a* and $V_{1118b}$ falls below $V_{REF}$ 1312*a*, which can indicate that the dV/dt rate reaches the first target dV/dt rate (for the dV/dt phase). Accordingly, comparator 1306 can provide a deasserted dV/dt low indication signal 1122. Also, because $V_{1118b}$ remains above $V_{REF}$ 1312*c*, which can indicate that the dV/dt rate has not reached the second target dV/dt rate (for the dI/dt phase), comparator 1304 can provide a deasserted dV/dt high indication signal 1120. Based on both dV/dt high indication signal 1120 and dV/dt low indication signal 1122 having the deasserted state, charge code determination circuit 1150 can store the start code 1160 representing drive strength $D_1$ as second charge code 934.

After reaching drive strength $D_1$, charge code determination circuit 1150 can continue incrementing the start code 1160 to obtain first charge code 932. Charge code determination circuit 1150 can continue incrementing start code 1160 by the same offset, or by a different offset, and provide charge signal 546 including the incremented start code 1160. Accordingly, the dV/dt rate of voltage signal 540 can continue increasing.

When the drive strength reaches $D_2$, $V_{1118a}-V_{1118b}>V_{REF1312a}-V_{REF1312c}$, which can indicate that the dV/dt rate reaches the second target dV/dt rate (due to the drive strength increase in the dI/dt phase). Accordingly, after $D_2$, comparator 1304 can provide an asserted dV/dt high indication signal 1120. Based on the asserted dV/dt high indication signal 1120 and the deasserted dV/dt low indication signal 1122, charge code determination circuit 1150 can store the most recent start code 1160 as first charge code 932.

Figure 15:
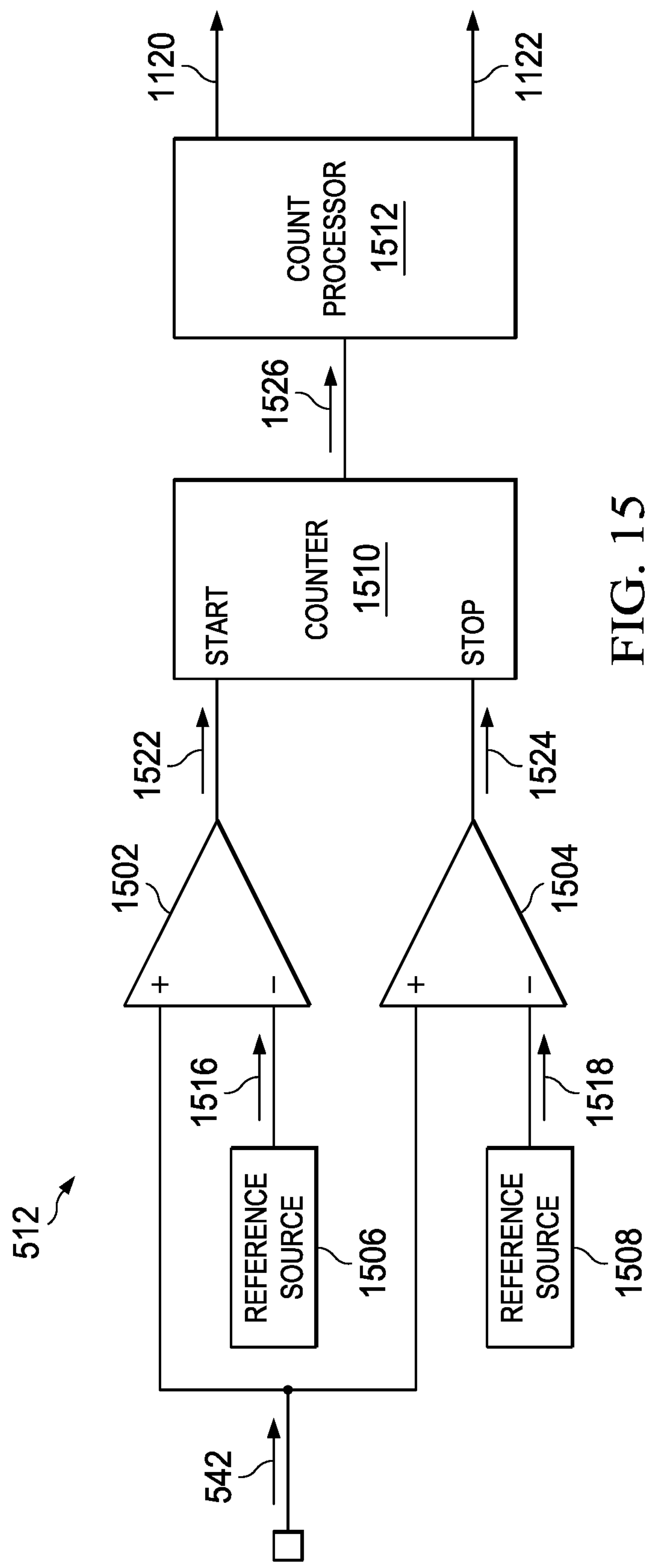
FIG. 15 includes a schematic of additional example internal components of the system of FIG. 7.

FIG. 15 is a schematic diagram illustrating additional example internal components of processing circuit 512 to implement the feedback loop for determining first charge code 932 and second charge code 934. The components described in FIG. 15 can use a time-based technique to measure the dV/dt rate of voltage signal 540. Referring to FIG. 15, processing circuit 512 can include a first comparator 1502, a second comparator 1504, a first reference source 1506, a second reference source 1508, a counter 1510, and a count processor 1512. Each of first comparator 1502 and second comparator 1504 can receive sensing result signal 542 from, for example, the example voltage sensing circuit of FIG. 9, where sensing result signal 542 can represent a scaled version of voltage signal 540 at current terminal 126 of transistor 112. First reference source 1506 can provide a first reference voltage 1516 to first comparator 1502, and second reference source 1508 can provide a second reference voltage 1518 to second comparator 1504. First reference voltage 1516 can be higher than second reference voltage 1518, and they can represent the thresholds that can be crossed by sensing result signal 542 as it drops during the dV/dt phase.

Figure 16:
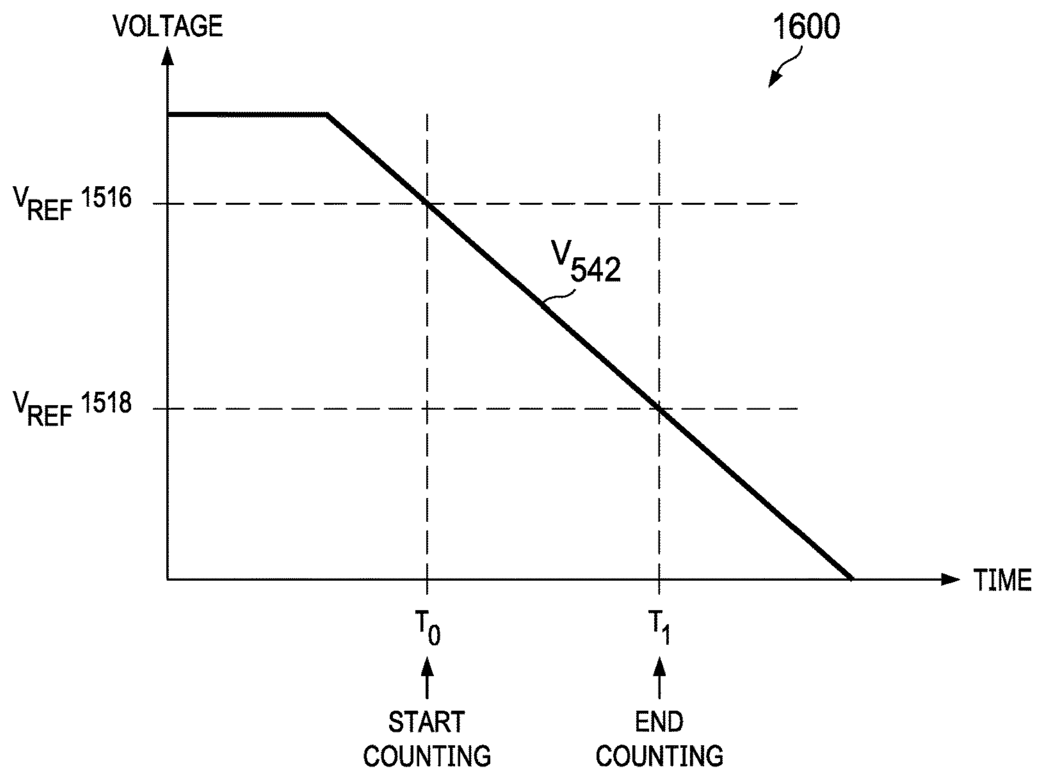
FIG. 16 includes a waveform graph that illustrates example operations of the internal components of FIG. 15.

FIG. 16 is a waveform diagram 1600 illustrating example operations of processing circuit 512 of FIG. 15 and includes time variations of sensing result signal 542, first reference voltage 1516, and second reference voltage 1518. Referring to FIG. 15 and FIG. 16, responsive to sensing result signal 542 (labelled $V_{542}$ in FIG. 16) dropping below first reference voltage 1516 (labelled $V_{REF}$ 1516 in FIG. 16) at time $T_0$, first comparator 1502 can provide a signal 1522 to start a count operation at counter 1510. As part of the count operation, counter 1510 can increase or decrease a count value based on a clock signal (not shown in the figures). Also, responsive to sensing result signal 542 dropping below second reference voltage 1518 (labelled $V_{REF}$ 1518 in FIG. 16), second comparator 1504 can provide a signal 1524 to end the count operation. Counter 1510 can then provide a final count value 1526 to count processor 1512. Final count value 1526 can provide a measurement of the time it takes for sensing result signal 542 to cross first reference voltage 1516 and second reference voltage 1518, which can reflect the dV/dt rates of sensing result signal 542 and of voltage signal 540. For example, a higher dV/dt rate can reduce final count value 1526, and a lower dV/dt rate can increase final count value 1526.

Count processor 1512 can receive final count value 1526 from counter 1510 and a target count value 1530 from, for example, control circuit 514. Target count value 1530 can be part of control signal 545 and can represent a target dV/dt rate. Count processor 1512 can receive different target count values 1530 to implement the feedback loops for first charge code 932 and second charge code 934. Count processor 1512 can compare between final count value 1526 and target count value 1530. If final count value 1526 exceeds target count value 1530, which can indicate that the dV/dt rate of voltage signal 540 is below the target rate, count processor 1512 can assert dV/dt low indication signal 1122. If final count value 1526 is below target count value 1530, which can indicate that the dV/dt rate of voltage signal 540 is higher the target rate, count processor 1512 can assert dV/dt high indication signal 1120.

Figure 17:
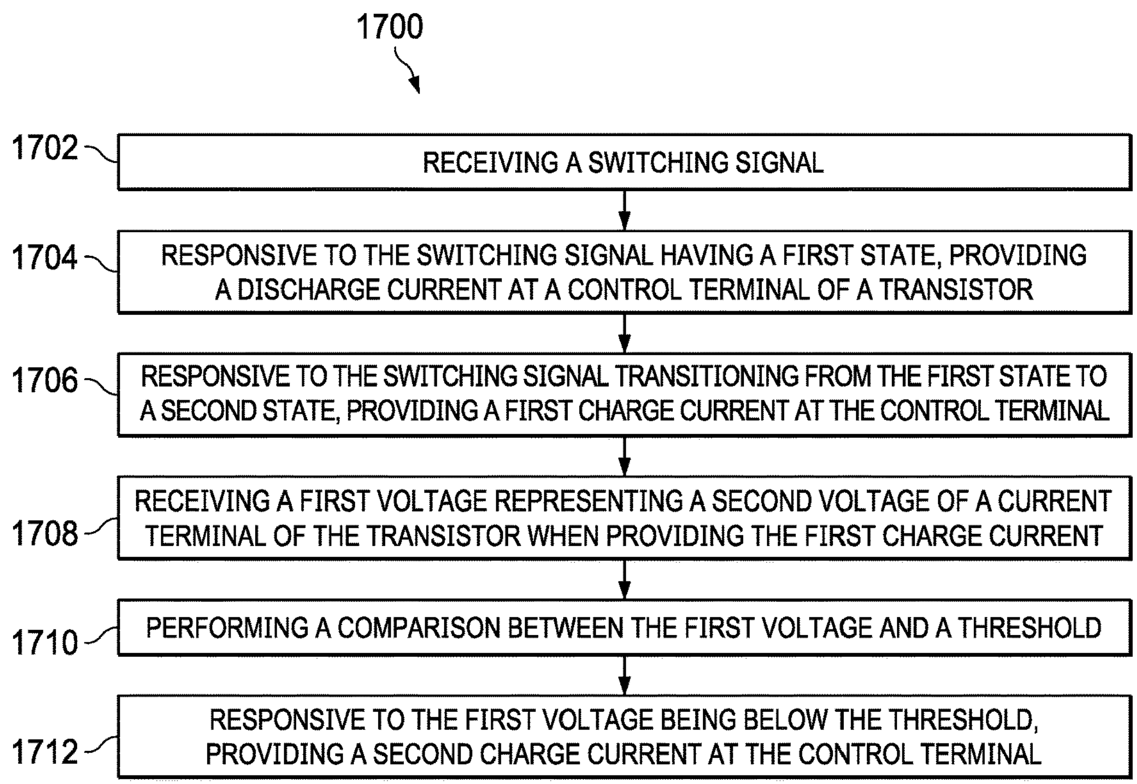
FIGS. 17 and 18 are flow charts illustrating methods of operating a transistor as a switch.

FIG. 17 illustrates a flowchart of an example method 1700 of controlling a transistor to operate as a switch, such as transistor 112. Method 1700 can be performed by system 500 of FIG. 5. Transistor 112 may be coupled between a power supply (e.g., power supply 102) and a load (e.g., load 104) and can be part of a H-bridge, as shown in FIG. 1.

In step 1702, system 700 can receive a switching signal, such as switching signal 142. Switching signal 142 can have a first state and a second state. Switching signal 142 can be part of a multi-cycle pulse width modulation (PWM) signal where each cycle can have a positive period and a negative period. Switching signal 142 can have the first state during the negative period and can have the second state during the positive period. Switching signal 142 having the first state can indicate that transistor 112 is to be disabled, and switching signal 142 having the second state can indicate that transistor 112 is to be enabled.

In step 1704, responsive to the switching signal being having the first state, system 500 can provide a discharge current a control terminal of the transistor.

Specifically, referring to FIG. 5, control circuit 514 can provide discharge signal 548 to driver circuit 516, which can provide discharge current 532 to discharge parasitic $C_{GS}$ and $C_{GD}$ capacitances at control terminal 124. By discharging the parasitic capacitances, the voltage at control terminal 124 can fall below a threshold for formation of a current channel between the current terminals of transistor 112, and transistor 112 can be disabled. Driver circuit 516 can include charge current source 520 and discharge current source 524, each of which can include one or more segmented current sources. Discharge signal 548 can include a digital code, such as second discharge code 938, to selectively enable/disable the segmented current sources of discharge current source 524 to set a magnitude of discharge current 532. Control circuit 514 can also provide charge signal 546 including a zero code to disable charge current source 520, and driver circuit 516 can provide a zero charge current 530 accordingly.

In step 1706, responsive to the switching signal transitioning from the first state to the second state, system 500 can provide a first charge current at the control terminal.

Specifically, as the switching signal transitions from the first state to the second state, which can indicate that transistor 112 is to be enabled, control circuit 514 can provide charge signal 546 including first charge code 932 to driver circuit 516, which can provide a non-zero charge current 530 (e.g., having the magnitude of $I_{C1}$ of FIG. 6) as the first charge current to charge the parasitic capacitances of control terminal 124. Control circuit 514 can also provide discharge current 532 having a zero code to disable discharge current source 524, and driver circuit 516 can provide a zero discharge current 532 accordingly.

System 500 can provide charge current 530 based on first charge code 932 during the dI/dt phase of enabling of transistor 112. Referring back to FIG. 2, during the dI/dt phase, most of the charge current is provided to charge the $C_{GS}$ parasitic capacitance of control terminal 124. The gate-source voltage $V_{GS}$ of transistor 112 can increase till reaching the plateau voltage $V_{GS,plateau}$, and the transistor current $I_T$ can also increase. The voltage of current terminal 126 can be held at a load voltage (e.g., $V_{BUS}$) initially as the $C_{GD}$ parasitic capacitance receives a slight portion of charge current. The voltage of current terminal 126 may also drop due to the rising transistor current $I_T$ and the parasitic inductance at current terminal 126.

In step 1708, system 500 can receive a first voltage (e.g., sensing result signal 542) representing a second voltage (e.g., voltage signal 540) at current terminal 126, when the first charge current is provided. For example, system 500 may include sensing circuit 510, which can include a capacitive divider, to generate sensing result signal 542 as a scaled version of voltage signal 540. In some examples, voltage signal 540 can also represent the drain-source voltage ($V_{DS}$) of transistor 112.

In step 1710, system 700 can perform a comparison between the first voltage and a threshold, such as a threshold derived from $V_{BUS}$ (e.g., $V_{REF0}$ in FIG. 6), to determine whether the first voltage falls below the threshold. The comparison can be performed by, for example, processing circuit 512.

In step 1712, responsive to the first voltage being below the threshold, system 500 can provide a second charge current at the control terminal.

Specifically, referring to FIG. 6, the dropping of the first voltage below the threshold can indicate the end of the dI/dt phase when $V_{GS}$ of transistor 112 reaches $V_{GS,plateau}$. The charge current provided by system 500 can be used to charge the Cm parasitic capacitance at control terminal 124, and the voltage of current terminal 126 can drop linearly at a constant dV/dt rate. This can correspond to the dV/dt phase of enabling of transistor 112. Responsive to the detection of the dV/dt phase, control circuit 514 can provide charge signal 546 including second charge code 934 to driver circuit 516, which can provide a non-zero charge current 530 (e.g., having the magnitude of $I_{C0}$ of FIG. 6) as the second charge current to charge the parasitic capacitances of control terminal 124. Control circuit 514 can also provide discharge current 532 having a zero code to disable discharge current source 524, and driver circuit 516 can provide a zero discharge current 532 accordingly. Control circuit 514 can provide the second charge current (and zero discharge current) through the rest of the positive period.

In some examples, control circuit 514 can provide a larger first charge current than the second charge current, with first charge code 932 being larger than second charge code 934. Such arrangements can increase the charge current provided during the dI/dt phase relative to the charge current provided during the dV/dt phase. The increased charge current can reduce the duration of the dI/dt phase, which can reduce switching loss. Also, by providing a reduced charge current for the dV/dt phase (relative to the dI/dt phase), the dV/dt rate of the voltage of current terminal 126 can be reduced, which can reduce electromagnetic interference (EMI) emission. Both first charge code 932 and second charge code 934 can be determined using a feedback loop and by sensing the dV/dt rate of voltage signal 540, as described above in FIGS. 9 through 16.

In some examples, system 500 can also perform short circuit and overcurrent handling operations during the positive period. A short circuit condition can occur when current terminal 126 of the transistor is electrically connected (shorted) to a supply voltage by a faulty switch, and the voltage of current terminal 126 (or $V_{DS}$) can exceed a first threshold voltage (e.g., $V_{REF1}$ of FIG. 9) based on the supply voltage $V_{BUS}$. Also, an overcurrent condition can occur when the transistor conducts a higher current than the current rating of the transistor, and the voltage of current terminal 126 (or $V_{DS}$) can exceed a second threshold voltage (e.g., $V_{REF2}$ of FIG. 10). The second threshold voltage can reflect the voltage of current terminal 126 (or $V_{DS}$) when transistor 112 conducts a current below its current rating.

Figure 18:
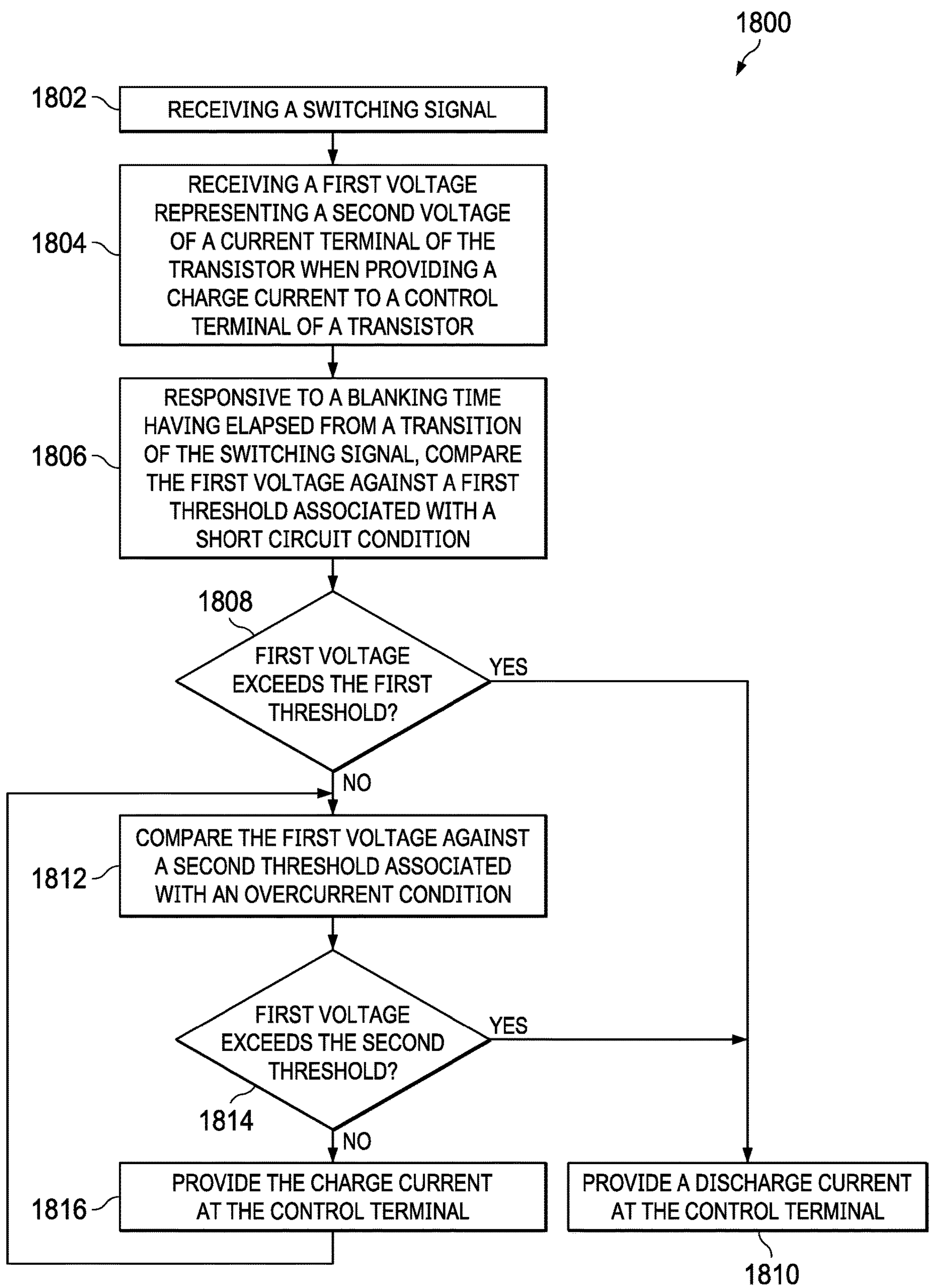

FIG. 18 illustrates a flowchart of an example method 1800 of controlling transistor 112 to handle short circuit and overcurrent conditions. Method 1800 can be performed by system 500 in parallel with method 1700.

In step 1802, system 500 can receive a switching signal, such as switching signal 142, which can have a first state and a second state, as described above.

In step 1804, system 500 can receive a first voltage (e.g., sensing result signal 542) representing a second voltage (e.g., voltage signal 540) at current terminal 126, when a charge current is provided to control terminal 124 of transistor 112. The charge current can be the first charge current or the second charge current in method 1700 of FIG. 17.

In step 1806, responsive to a blanking time having elapsed from a transition of the switching signal from the first state to the second state, system 500 can compare the first voltage against a first threshold associated with a short circuit condition (e.g., $V_{REF1}$ of FIG. 7).

Specifically, System 500 can wait for a blanking time period after the transition of the switching signal, and then compare the first voltage against the first threshold. The blanking time can account for delay in charging of the parasitic capacitance of control terminal 124 by the charge current. Accordingly, the comparison between the first voltage and the first threshold can be performed during after the dI/dt phase has ended, and can be during the later part of the dV/dt phase, when the voltage of current terminal 126 is supposed to continue dropping absent the short circuit condition. Such arrangements can avoid (or at least reduce the likelihood of) false detection of short circuit condition.

In step 1808, system 500 can determine whether the first voltage exceeds the first threshold. If it is, system 700 can proceed to step 1810 and provide a discharge current 532 at the control terminal (and reduce charge current 530 to zero) to disable transistor 112. In some examples, system 700 can perform a soft discharge operation, in which system 500 can provide a reduced discharge current (e.g., compared with the discharge current during the negative period), to reduce voltage stress on transistor 112.

If system 500 determines that the first voltage does not exceed the first threshold (in step 1808), system 500 can proceed to step 1812 and compare the first voltage against a second threshold associated with an overcurrent condition (e.g., $V_{REF2}$ of FIG. 8). The second threshold can be lower than the first threshold. If system 500 determines that the first voltage exceeds the second threshold in step 1814, it may proceed to step 1810 and provide discharge current 532 at the control terminal. If system 500 determines that the first voltage exceeds the second threshold (in step 1808), system 500 can proceed to step 1816 and continue to provide the charge current at the control terminal. System 500 can continue performing steps 1812 through 1816 for the rest of the positive period of switching signal 142 when switching signal 142 has the second state.

In this description, the term "couple" may cover connections, communications or signal paths that enable a functional relationship consistent with this description. For example, if device A provides a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal provided by device A.

In this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described herein as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between identical two nodes as the single resistor or capacitor.

Uses of the phrase "ground voltage potential" in this description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described examples, and other examples are possible, within the scope of the claims.

What is claimed is:

1. An apparatus comprising:

a voltage sensing circuit having a voltage sensing terminal and a voltage sensing output, the voltage sensing circuit configured to generate a first voltage at the voltage sensing output representing a second voltage at the voltage sensing terminal;

a control circuit having a control circuit input and a control circuit output, the control circuit input coupled to the voltage sensing output, the control circuit configured to:

determine a state of a transistor based on the first voltage; and generate a driver signal at the control circuit output based on the state; and a driver circuit having a driver input and a switch control output, the driver input coupled to the control circuit output, the driver circuit configured to provide a current at the switch control output responsive to the driver signal, wherein:

the voltage sensing terminal is adapted to be coupled to a current terminal of the transistor;

the switch control output is adapted to be coupled to a control terminal of the transistor; and the voltage sensing circuit includes a first capacitor and a second capacitor, the first capacitor coupled between the voltage sensing terminal and the voltage sensing output, and the second capacitor adapted to be coupled between the voltage sensing output and a voltage source.

2. The apparatus of claim 1, further comprising a processing circuit having a processing input and a processing output, the processing input coupled to the voltage sensing output, the processing output coupled to the control circuit input, and the processing circuit including:

a reference generator having a reference output; and a comparator having a comparator output and first and second comparator inputs, the first comparator input coupled to the processing input, the second comparator input coupled to the reference output, and the comparator output coupled to the processing output, the comparator configured to generate an indication signal at the comparator output responsive to the first voltage at the first comparator input and a reference voltage at the reference output.

3. The apparatus of claim 2, wherein:

the driver signal is a first driver signal;

the current is a first charge current;

the control circuit is configured to:

generate the first driver signal at the control circuit output responsive to the indication signal indicating that the first voltage exceeds the reference voltage; and generate a second driver signal at the control circuit output responsive to the indication signal indicating that the first voltage is below the reference voltage; and the driver circuit is configured to generate first and second charge currents at the switch control output responsive to the respective first and second driver signals to charge the control terminal.

4. The apparatus of claim 2, wherein:

the driver signal is a first driver signal;

the current is a charge current;

the control circuit input is a first control circuit input;

the control circuit has a second control circuit input, the control circuit configured to:

receive a switching signal at the second control circuit input;

generate the first driver signal responsive to the switching signal having a first state; and generate a second driver signal responsive to the switching signal having a second state; and the driver circuit is configured to:

generate a discharge current at the switch control output responsive to the first driver signal to discharge the control terminal; and generate a charge current at the switch control output responsive to the second driver signal to charge the control terminal.

5. The apparatus of claim 4, further comprising a delay circuit having a delay output and a delay input, the delay input coupled to the second control circuit input;

wherein:

the discharge current is a first discharge current;

the comparator has a timing input coupled to the delay output, and the comparator is configured to generate the indication signal responsive to a transition of the switching signal at the timing input;

the control circuit is configured to generate a third driver signal responsive to the indication signal indicating that the first voltage exceeds the reference voltage; and the driver circuit is configured to generate a second discharge current to discharge the control terminal responsive to the third driver signal.

6. The apparatus of claim 5, wherein the second discharge current is less than the first discharge current.

7. The apparatus of claim 5, wherein:

the reference voltage is a first reference voltage;

the reference generator has a reference selection input and is configured to:

provide the first reference voltage at the reference output responsive to a first selection signal at the reference selection input; and provide a second reference voltage at the reference output responsive to a second selection signal at the reference selection input, the second reference voltage being lower than the first reference voltage; and the control circuit has a reference selection output coupled to the reference selection input, and the control circuit is configured to:

provide the first selection signal at the reference selection output;

responsive to the indication signal indicating that the first voltage does not exceed the first reference voltage, provide the second selection signal at the reference selection output; and generate the third driver signal responsive to the indication signal indicating that the first voltage exceeds the second reference voltage.

8. The apparatus of claim 3, wherein the control circuit is configured to generate the first and second driver signals in respective first and second phases of enabling of the transistor, the second phase being preceded by the first phase.

9. The apparatus of claim 8, wherein the first charge current is higher than the second charge current.

10. The apparatus of claim 9, wherein:

the control circuit is configured to generate a third driver signal at the control circuit output in a third phase of enabling of the transistor, and the third phase is preceded by the first and second phases; and the driver circuit is configured to generate a third charge current at the switch control output to charge the control terminal responsive to the third driver signal, the third charge current being higher than the first and second charge current.

11. The apparatus of claim 8, wherein the control circuit is configured to:

in a first feedback loop:

generate a first comparison result responsive to a comparison between: a first target rate; and a rate of change of the first voltage introduced by the first driver signal; and adjust the first driver signal based on the first comparison result; and in a second feedback loop:

generate a second comparison result responsive to a comparison between: a second target rate; and a rate of change of the first voltage introduced by the second driver signal; and adjust the second driver signal based on the second comparison result.

12. The apparatus of claim 11, wherein the voltage sensing circuit includes:

a differentiator circuit having a differentiator input and a differentiator output, the differentiator input coupled to the voltage sensing terminal;

a peak detector having a detector input and a detector output, the detector input coupled to the differentiator output;

a bias buffer having a bias output; and an amplifier having a first amplifier input, a second amplifier input, a first amplifier output, and a second amplifier output, the first amplifier input coupled to the detector output, the second amplifier input coupled to the bias output, and the first and second amplifiers output coupled to the voltage sensing output, the amplifier configured to provide a pair of differential voltage signals at the first and second amplifier outputs, the pair of differential voltage signals representing a voltage difference between the detector output and the bias output.

13. The apparatus of claim 12, wherein:

the reference output is a first reference output;

the reference generator has a second and third reference outputs;

the comparator is a first comparator, the first comparator input of the first comparator is coupled to the first and second amplifier outputs, and the second comparator input of the first comparator is coupled to the first and second reference outputs;

the comparator output is a first comparator output;

the processing output is a first processing output;

the indication signal is a first indication signal;

the processing circuit has a second processing output and includes:

a second comparator having a second comparator output and third and fourth comparator inputs, the third comparator input coupled to the first and second amplifier outputs, the fourth comparator input coupled to the first and third reference outputs, and the second comparator output coupled to the second processing output;

the first comparator is configured to provide the first indication signal at the first comparator output to indicate whether the rate of change of the first voltage is below a first target rate; and the second comparator is configured to provide a second indication signal at the second comparator output to indicate whether the rate of change of the first voltage is above a second target rate higher than the first target rate.

14. The apparatus of claim 11, wherein:

the reference output is a first reference output;

the reference generator has a second reference output;

the comparator is a first comparator;

the comparator output is a first comparator output;

the processing circuit further includes:

a second comparator having a third comparator input coupled to the processing input, a fourth comparator input coupled to the second reference output, and a second comparator output;

a counter having a start input, and end input, and a count output, the start input coupled to the first comparator output, and the end input coupled to the second comparator output; and a count processor having a count input and an indication output, the count input coupled to the count output, the indication output coupled to the processing output, and the count processor configured to provide the indication signal based on comparing a count value at the count input with a count threshold representing a target rate.

15. A method comprising:

receiving a switching signal;

responsive to the switching signal having a first state, providing a first discharge current at a control terminal of a transistor;

responsive to the switching signal transitioning from the first state to a second state, providing a first charge current at the control terminal;

receiving a first voltage representing a second voltage of a current terminal of the transistor when providing the first charge current;

performing a comparison between the first voltage and a first threshold;

responsive to the first voltage being below the threshold, providing a second charge current at the control terminal of the transistor;

responsive to a pre-determined time having elapsed from the transition, performing a comparison between the first voltage and a second threshold; and responsive to the first voltage exceeding the second threshold, providing a second discharge current at the control terminal, the second discharge current being lower than the first discharge current.

16. The method of claim 15, wherein the second charge current is lower than the first charge current.

17. The method of claim 15, further comprising:

responsive to the first voltage being below the second threshold, and the switching signal having the second state, performing a comparison between the first voltage and a third threshold, the third threshold being below the second threshold; and responsive to the first voltage exceeding the third threshold, providing the second discharge current at the control terminal.

18. The method of claim 15, further comprising:

in a first feedback loop:

generating a first comparison result responsive to a comparison between: a first target rate; and a rate of change of the first voltage introduced by the first charge current; and adjusting the first charge current based on the first comparison result; and in a second feedback loop:

generating a second comparison result responsive to a comparison between: a second target rate; and a rate of change of the first voltage introduced by the second charge current; and adjusting the second charge current based on the second comparison result.

* * * * *